(12) United States Patent
Seo et al.

(10) Patent No.: US 9,601,529 B2
(45) Date of Patent: *Mar. 21, 2017

(54) LIGHT ABSORPTION AND FILTERING PROPERTIES OF VERTICALLY ORIENTED SEMICONDUCTOR NANO WIRES

(71) Applicants: PRESIDENT AND FELLOWS OF HARVARD COLLEGE, Cambridge, MA (US); ZENA TECHNOLOGIES, INC., Cambridge, MA (US)

(72) Inventors: Kwanyong Seo, Cambridge, MA (US); Munib Wober, Topsfield, MA (US); Paul Steinvurzel, Cambridge, MA (US); Ethan Schonbrun, Newton Highlands, MA (US); Yaping Dan, Cambridge, MA (US); Kenneth Crozier, Cambridge, MA (US)

(73) Assignees: ZENA TECHNOLOGIES, INC., Cambridge, MA (US); PRESIDENT AND FELLOWS OF HARVARD COLLEGE, Cambridge, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/632,739

(22) Filed: Feb. 26, 2015

(65) Prior Publication Data

US 2015/0171244 A1 Jun. 18, 2015

Related U.S. Application Data

(63) Continuation of application No. 12/910,664, filed on Oct. 22, 2010, now Pat. No. 9,000,353.

(Continued)

(51) Int. Cl.
*H01L 27/14* (2006.01)
*H01L 27/146* (2006.01)
(Continued)

(52) U.S. Cl.
CPC ........ *H01L 27/14607* (2013.01); *B82Y 20/00* (2013.01); *B82Y 30/00* (2013.01);
(Continued)

(58) Field of Classification Search
CPC ........... H01L 27/14603; H01L 27/1446; H01L 27/14692; H01L 27/14607; H01L 31/035227
See application file for complete search history.

(56) References Cited

U.S. PATENT DOCUMENTS 1,918,848 A  7/1933 Land
3,903,427 A  9/1975 Pack
(Continued)

FOREIGN PATENT DOCUMENTS

CN  1624925  6/2005
CN  1306619  3/2007
(Continued)

OTHER PUBLICATIONS

Kim, Y.S. et al., "ITO/AU/ITO multilayer thin films for transparent conducting electrode applications", Applied Surface Science, vol. 254 (2007), pp. 1524-1527.
(Continued)

*Primary Examiner* — Tony Ko
(74) *Attorney, Agent, or Firm* — Pillsbury Winthrop Shaw Pittman LLP

(57) ABSTRACT

A nanowire array is described herein. The nanowire array comprises a substrate and a plurality of nanowires extending essentially vertically from the substrate; wherein: each of the nanowires has uniform chemical along its entire length; a refractive index of the nanowires is at least two times of a refractive index of a cladding of the nanowires. This nanowire array is useful as a photodetector, a submicron color filter, a static color display or a dynamic color display.

32 Claims, 14 Drawing Sheets

Related U.S. Application Data

(60) Provisional application No. 61/357,429, filed on Jun. 22, 2010.

(51) Int. Cl.

| | |
|---|---|
| *B82Y 20/00* | (2011.01) |
| *B82Y 30/00* | (2011.01) |
| *B82Y 40/00* | (2011.01) |
| *H01L 31/0352* | (2006.01) |
| *F21V 9/08* | (2006.01) |
| *G02B 5/22* | (2006.01) |
| *H01L 31/18* | (2006.01) |
| *G09F 13/00* | (2006.01) |
| *H01L 27/144* | (2006.01) |
| *H01L 31/107* | (2006.01) |
| *B82Y 99/00* | (2011.01) |

(52) U.S. Cl.
CPC .............. *B82Y 40/00* (2013.01); *F21V 9/08* (2013.01); *G02B 5/22* (2013.01); *G09F 13/00* (2013.01); *H01L 27/1446* (2013.01); *H01L 27/14603* (2013.01); *H01L 27/14629* (2013.01); *H01L 27/14692* (2013.01); *H01L 31/035227* (2013.01); *H01L 31/107* (2013.01); *H01L 31/18* (2013.01); *B82Y 99/00* (2013.01); *Y10S 977/762* (2013.01); *Y10S 977/888* (2013.01); *Y10S 977/954* (2013.01); *Y10T 428/24174* (2015.01); *Y10T 428/24893* (2015.01)

(56) References Cited

U.S. PATENT DOCUMENTS

| | | |
|---|---|---|
| 4,017,332 A | 4/1977 | James |
| 4,292,512 A | 9/1981 | Miller |
| 4,316,048 A | 2/1982 | Woodall |
| 4,357,415 A | 11/1982 | Hartman |
| 4,387,265 A | 6/1983 | Dalal |
| 4,394,571 A | 7/1983 | Jurisson |
| 4,400,221 A | 8/1983 | Rahilly |
| 4,443,890 A | 4/1984 | Eumurian |
| 4,513,168 A | 4/1985 | Borden |
| 4,531,055 A | 7/1985 | Shepherd, Jr. |
| 4,620,237 A | 10/1986 | Traino |
| 4,678,772 A | 7/1987 | Segal |
| 4,827,335 A | 5/1989 | Saito |
| 4,846,556 A | 7/1989 | Haneda |
| 4,857,973 A | 8/1989 | Yang |
| 4,876,586 A | 10/1989 | Dyck |
| 4,880,613 A | 11/1989 | Satoh |
| 4,896,941 A | 1/1990 | Hayashi |
| 4,950,625 A | 8/1990 | Nakashima |
| 4,971,928 A | 11/1990 | Fuller |
| 4,972,244 A | 11/1990 | Buffet |
| 4,990,988 A | 2/1991 | Lin |
| 5,071,490 A | 12/1991 | Yokota |
| 5,081,049 A | 1/1992 | Green |
| 5,096,520 A | 3/1992 | Faris |
| 5,124,543 A | 6/1992 | Kawashima |
| 5,217,911 A | 6/1993 | Denda |
| 5,247,349 A | 9/1993 | Olego |
| 5,272,518 A | 12/1993 | Vincent |
| 5,311,047 A | 5/1994 | Chang |
| 5,347,147 A | 9/1994 | Jones |
| 5,362,972 A | 11/1994 | Yazawa |
| 5,374,841 A | 12/1994 | Goodwin |
| 5,391,896 A | 2/1995 | Wanlass |
| 5,401,968 A | 3/1995 | Cox |
| 5,449,626 A | 9/1995 | Hezel |
| 5,468,652 A | 11/1995 | Gee |
| 5,602,661 A | 2/1997 | Schadt |
| 5,612,780 A | 3/1997 | Rickenbach |
| 5,671,914 A | 9/1997 | Kalkhoran |
| 5,696,863 A | 12/1997 | Kleinerman |
| 5,723,945 A | 3/1998 | Schermerhorn |
| 5,747,796 A | 5/1998 | Heard |
| 5,767,507 A | 6/1998 | Unlu |
| 5,798,535 A | 8/1998 | Huang |
| 5,844,290 A | 12/1998 | Furumiya |
| 5,853,446 A | 12/1998 | Carre |
| 5,857,053 A | 1/1999 | Kane |
| 5,877,492 A | 3/1999 | Fujieda |
| 5,880,495 A | 3/1999 | Chen |
| 5,885,881 A | 3/1999 | Ojha |
| 5,900,623 A | 5/1999 | Tsang |
| 5,943,463 A | 8/1999 | Unuma |
| 5,968,528 A | 10/1999 | Deckner |
| 6,013,871 A | 1/2000 | Curtin |
| 6,033,582 A | 3/2000 | Lee |
| 6,037,243 A | 3/2000 | Ha |
| 6,046,466 A | 4/2000 | Ishida |
| 6,074,892 A | 6/2000 | Bowers |
| 6,100,551 A | 8/2000 | Lee |
| 6,270,548 B1 | 8/2001 | Campbell |
| 6,301,420 B1 | 10/2001 | Greenaway |
| 6,326,649 B1 | 12/2001 | Chang |
| 6,388,243 B1 | 5/2002 | Berezin |
| 6,388,648 B1 | 5/2002 | Clifton |
| 6,407,439 B1 | 6/2002 | Hier |
| 6,459,034 B2 | 10/2002 | Muramoto |
| 6,463,204 B1 | 10/2002 | Ati |
| 6,542,231 B1 | 4/2003 | Garrett |
| 6,563,995 B2 | 5/2003 | Keaton |
| 6,566,723 B1 | 5/2003 | Vook |
| 6,680,216 B2 | 1/2004 | Kwasnick |
| 6,709,929 B2 | 3/2004 | Zhang |
| 6,720,594 B2 | 4/2004 | Rahn |
| 6,771,314 B1 | 8/2004 | Bawolek |
| 6,805,139 B1 | 10/2004 | Savas |
| 6,812,473 B1 | 11/2004 | Amemiya |
| 6,904,187 B2 | 6/2005 | Fischer et al. |
| 6,927,145 B1 | 8/2005 | Yang |
| 6,960,526 B1 | 11/2005 | Shah |
| 6,967,120 B2 | 11/2005 | Jang |
| 6,969,899 B2 | 11/2005 | Yaung |
| 6,987,258 B2 | 1/2006 | Mates |
| 6,996,147 B2 | 2/2006 | Majumdar |
| 7,052,927 B1 | 5/2006 | Fletcher |
| 7,064,372 B2 | 6/2006 | Duan |
| 7,105,428 B2 | 9/2006 | Pan |
| 7,106,938 B2 | 9/2006 | Baek et al. |
| 7,109,517 B2 | 9/2006 | Zaidi |
| 7,153,720 B2 | 12/2006 | Augusto |
| 7,163,659 B2 | 1/2007 | Stasiak |
| 7,192,533 B2 | 3/2007 | Bakkers |
| 7,208,783 B2 | 4/2007 | Palsule |
| 7,230,286 B2 | 6/2007 | Cohen |
| 7,235,475 B2 | 6/2007 | Kamins |
| 7,241,434 B2 | 7/2007 | Anthony |
| 7,253,017 B1 | 8/2007 | Roscheisen |
| 7,254,151 B2 | 8/2007 | Lieber |
| 7,262,400 B2 | 8/2007 | Yaung |
| 7,265,328 B2 | 9/2007 | Mouli |
| 7,272,287 B2 | 9/2007 | Bise |
| 7,285,812 B2 | 10/2007 | Tang |
| 7,306,963 B2 | 12/2007 | Linden |
| 7,307,327 B2 | 12/2007 | Bahl |
| 7,311,889 B2 | 12/2007 | Awano |
| 7,326,915 B2 | 2/2008 | Kaluzhny |
| 7,330,404 B2 | 2/2008 | Peng |
| 7,335,962 B2 | 2/2008 | Mouli |
| 7,336,860 B2 | 2/2008 | Cyr |
| 7,339,110 B1 | 3/2008 | Mulligan et al. |
| 7,358,583 B2 | 4/2008 | Reznik |
| 7,381,966 B2 | 6/2008 | Starikov |
| 7,388,147 B2 | 6/2008 | Mulligan |
| 7,416,911 B2 | 8/2008 | Heath |
| 7,446,025 B2 | 11/2008 | Cohen |
| 7,462,774 B2 | 12/2008 | Roscheisen |
| 7,471,428 B2 | 12/2008 | Ohara |
| 7,491,269 B2 | 2/2009 | Legagneux |

(56) References Cited

U.S. PATENT DOCUMENTS

| | | |
|---|---|---|
| 7,507,293 B2 | 3/2009 | Li |
| 7,521,322 B2 | 4/2009 | Tang |
| 7,524,694 B2 | 4/2009 | Adkisson |
| 7,582,857 B2 | 9/2009 | Gruev |
| 7,598,482 B1 | 10/2009 | Verhulst |
| 7,622,367 B1 | 11/2009 | Nuzzo |
| 7,626,685 B2 | 12/2009 | Jin |
| 7,646,138 B2 | 1/2010 | Williams |
| 7,646,943 B1 | 1/2010 | Wober |
| 7,647,695 B2 | 1/2010 | MacNutt |
| 7,649,665 B2 | 1/2010 | Kempa |
| 7,655,860 B2 | 2/2010 | Parsons |
| 7,663,202 B2 | 2/2010 | Wang |
| 7,692,860 B2 | 4/2010 | Sato |
| 7,704,806 B2 | 4/2010 | Chae |
| 7,713,779 B2 | 5/2010 | Firon |
| 7,719,678 B2 | 5/2010 | Kamins |
| 7,719,688 B2 | 5/2010 | Kamins |
| 7,732,769 B2 | 6/2010 | Snider |
| 7,732,839 B2 | 6/2010 | Sebe |
| 7,736,954 B2 | 6/2010 | Hussain |
| 7,740,824 B2 | 6/2010 | Godfried |
| 7,790,495 B2 | 9/2010 | Assefa |
| 7,888,155 B2 | 2/2011 | Chen |
| 7,902,540 B2 | 3/2011 | Cohen |
| 7,948,555 B2 | 5/2011 | Kwon et al. |
| 8,030,729 B2 | 10/2011 | Quitoriano |
| 8,035,184 B1 | 10/2011 | Dutta |
| 8,049,203 B2 | 11/2011 | Samuelson |
| 8,063,450 B2 | 11/2011 | Wernersson |
| 8,067,299 B2 | 11/2011 | Samuelson |
| 8,067,736 B2 | 11/2011 | Gruss |
| 8,084,728 B2 | 12/2011 | Tsang |
| 8,093,675 B2 | 1/2012 | Tsunemi |
| 8,118,170 B2 | 2/2012 | Sato |
| 8,143,658 B2 | 3/2012 | Samuelson |
| 8,154,127 B1 | 4/2012 | Kamins |
| 8,193,524 B2 | 6/2012 | Bjoerk |
| 8,208,776 B2 | 6/2012 | Tokushima |
| 8,212,138 B2 | 7/2012 | Landis |
| 8,222,705 B2 | 7/2012 | Ogino |
| 8,242,353 B2 | 8/2012 | Karg |
| 8,269,985 B2 | 9/2012 | Wober |
| 8,274,039 B2 | 9/2012 | Wober |
| 8,299,472 B2 | 10/2012 | Yu |
| 8,330,090 B2 | 12/2012 | Agarwal |
| 8,384,007 B2 | 2/2013 | Yu |
| 8,455,857 B2 | 6/2013 | Samuelson |
| 8,471,190 B2 | 6/2013 | Wober |
| 8,514,411 B2 | 8/2013 | Wober |
| 8,546,742 B2 | 10/2013 | Wober |
| 8,748,799 B2 | 6/2014 | Wober |
| 8,766,272 B2 | 7/2014 | Yu et al. |
| 8,791,470 B2 | 7/2014 | Wober |
| 8,810,808 B2 | 8/2014 | Wober |
| 8,835,831 B2 | 9/2014 | Yu et al. |
| 8,866,065 B2 | 10/2014 | Wober |
| 2002/0003201 A1 | 1/2002 | Yu |
| 2002/0020846 A1 | 2/2002 | Pi |
| 2002/0021879 A1 | 2/2002 | Lee |
| 2002/0071468 A1 | 6/2002 | Sandstrom |
| 2002/0104821 A1 | 8/2002 | Bazylenko |
| 2002/0109082 A1 | 8/2002 | Nakayama |
| 2002/0117675 A1 | 8/2002 | Mascarenhas |
| 2002/0130311 A1 | 9/2002 | Lieber |
| 2002/0172820 A1 | 11/2002 | Majumdar |
| 2003/0003300 A1 | 1/2003 | Korgel |
| 2003/0006363 A1 | 1/2003 | Campbell |
| 2003/0077907 A1 | 4/2003 | Kao |
| 2003/0089899 A1 | 5/2003 | Lieber |
| 2003/0103744 A1 | 6/2003 | Koyama |
| 2003/0132480 A1 | 7/2003 | Chau |
| 2003/0160176 A1 | 8/2003 | Vispute |
| 2003/0189202 A1 | 10/2003 | Li |
| 2003/0227090 A1 | 12/2003 | Okabe |
| 2004/0011975 A1 | 1/2004 | Nicoli |
| 2004/0021062 A1 | 2/2004 | Zaidi |
| 2004/0026684 A1 | 2/2004 | Empedocles |
| 2004/0058058 A1 | 3/2004 | Shchegolikhin |
| 2004/0065362 A1 | 4/2004 | Watabe |
| 2004/0075464 A1 | 4/2004 | Samuelson |
| 2004/0095658 A1 | 5/2004 | Buretea |
| 2004/0109666 A1 | 6/2004 | Kim |
| 2004/0114847 A1 | 6/2004 | Fischer et al. |
| 2004/0118337 A1 | 6/2004 | Mizutani |
| 2004/0118377 A1 | 6/2004 | Bloms |
| 2004/0122328 A1 | 6/2004 | Wang |
| 2004/0124366 A1 | 7/2004 | Zeng |
| 2004/0155247 A1 | 8/2004 | Benthien |
| 2004/0156610 A1 | 8/2004 | Charlton |
| 2004/0160522 A1 | 8/2004 | Fossum |
| 2004/0180461 A1 | 9/2004 | Yaung |
| 2004/0213307 A1 | 10/2004 | Lieber |
| 2004/0217086 A1 | 11/2004 | Kawashima |
| 2004/0223681 A1 | 11/2004 | Block |
| 2004/0241965 A1 | 12/2004 | Merritt |
| 2004/0252957 A1 | 12/2004 | Schmidt et al. |
| 2004/0261840 A1 | 12/2004 | Schmit |
| 2005/0009224 A1 | 1/2005 | Yang |
| 2005/0035381 A1 | 2/2005 | Holm |
| 2005/0082676 A1 | 4/2005 | Andry |
| 2005/0087601 A1 | 4/2005 | Gerst |
| 2005/0095699 A1 | 5/2005 | Miyauchi |
| 2005/0109388 A1 | 5/2005 | Murakami |
| 2005/0116271 A1 | 6/2005 | Kato |
| 2005/0133476 A1 | 6/2005 | Islam |
| 2005/0161662 A1 | 7/2005 | Majumdar |
| 2005/0164514 A1 | 7/2005 | Rauf |
| 2005/0190453 A1 | 9/2005 | Dobashi |
| 2005/0201704 A1 | 9/2005 | Ellwood |
| 2005/0218468 A1 | 10/2005 | Owen |
| 2005/0224707 A1 | 10/2005 | Guedj |
| 2005/0242409 A1 | 11/2005 | Yang |
| 2005/0284517 A1 | 12/2005 | Shinohara |
| 2006/0011362 A1 | 1/2006 | Tao |
| 2006/0027071 A1 | 2/2006 | Barnett |
| 2006/0038990 A1 | 2/2006 | Habib |
| 2006/0113622 A1 | 6/2006 | Adkisson |
| 2006/0115230 A1 | 6/2006 | Komoguchi et al. |
| 2006/0121371 A1 | 6/2006 | Wu |
| 2006/0146323 A1 | 7/2006 | Bratkovski |
| 2006/0162766 A1 | 7/2006 | Gee |
| 2006/0180197 A1 | 8/2006 | Gui |
| 2006/0208320 A1 | 9/2006 | Tsuchiya et al. |
| 2006/0257071 A1 | 11/2006 | Bise |
| 2006/0260674 A1 | 11/2006 | Tran |
| 2006/0273262 A1 | 12/2006 | Sayag |
| 2006/0273389 A1 | 12/2006 | Cohen |
| 2006/0284118 A1 | 12/2006 | Asmussen |
| 2007/0012980 A1 | 1/2007 | Duan |
| 2007/0012985 A1 | 1/2007 | Stumbo |
| 2007/0023799 A1 | 2/2007 | Boettiger |
| 2007/0025504 A1 | 2/2007 | Tumer |
| 2007/0029545 A1 | 2/2007 | Striakhilev |
| 2007/0052050 A1 | 3/2007 | Dierickx |
| 2007/0076481 A1 | 4/2007 | Tennant |
| 2007/0082255 A1 | 4/2007 | Sun |
| 2007/0099292 A1 | 5/2007 | Miller |
| 2007/0104441 A1 | 5/2007 | Ahn |
| 2007/0107773 A1 | 5/2007 | Fork |
| 2007/0108371 A1 | 5/2007 | Stevens |
| 2007/0114622 A1 | 5/2007 | Adkisson |
| 2007/0120254 A1 | 5/2007 | Hurkx |
| 2007/0126037 A1 | 6/2007 | Ikeda |
| 2007/0137697 A1 | 6/2007 | Kempa |
| 2007/0138376 A1 | 6/2007 | Naughton |
| 2007/0138380 A1 | 6/2007 | Adkisson |
| 2007/0138459 A1 | 6/2007 | Wong |
| 2007/0139740 A1 | 6/2007 | Igura |
| 2007/0140638 A1 | 6/2007 | Yang |
| 2007/0145512 A1 | 6/2007 | Rhodes |
| 2007/0148599 A1 | 6/2007 | True |
| 2007/0152248 A1 | 7/2007 | Choi |
| 2007/0155025 A1 | 7/2007 | Zhang |

(56) References Cited

U.S. PATENT DOCUMENTS

| | | |
|---|---|---|
| 2007/0164270 A1 | 7/2007 | Majumdar |
| 2007/0170418 A1 | 7/2007 | Bowers |
| 2007/0172623 A1 | 7/2007 | Kresse |
| 2007/0172970 A1 | 7/2007 | Uya |
| 2007/0187787 A1 | 8/2007 | Ackerson |
| 2007/0196239 A1 | 8/2007 | Vink |
| 2007/0200054 A1 | 8/2007 | Reznik |
| 2007/0205483 A1 | 9/2007 | Williams |
| 2007/0217754 A1 | 9/2007 | Sasaki |
| 2007/0228421 A1 | 10/2007 | Shioya |
| 2007/0238265 A1 | 10/2007 | Kurashina |
| 2007/0238285 A1 | 10/2007 | Borden |
| 2007/0241260 A1 | 10/2007 | Jaeger |
| 2007/0246689 A1 | 10/2007 | Ge |
| 2007/0248958 A1 | 10/2007 | Jovanovich |
| 2007/0272828 A1 | 11/2007 | Xu |
| 2007/0278500 A1 | 12/2007 | Lin |
| 2007/0285378 A1 | 12/2007 | Lankhorst |
| 2007/0290193 A1 | 12/2007 | Tucker |
| 2007/0290265 A1 | 12/2007 | Augusto |
| 2008/0001498 A1 | 1/2008 | Muller |
| 2008/0006319 A1 | 1/2008 | Bettge |
| 2008/0029701 A1 | 2/2008 | Onozawa |
| 2008/0036038 A1 | 2/2008 | Hersee |
| 2008/0044984 A1 | 2/2008 | Hsieh |
| 2008/0047601 A1 | 2/2008 | Nag |
| 2008/0047604 A1 | 2/2008 | Korevaar |
| 2008/0055451 A1 | 3/2008 | Kanbe |
| 2008/0065451 A1 | 3/2008 | For |
| 2008/0073742 A1 | 3/2008 | Adkisson |
| 2008/0079022 A1 | 4/2008 | Yamamoto |
| 2008/0079076 A1 | 4/2008 | Sheen |
| 2008/0083963 A1 | 4/2008 | Hsu |
| 2008/0088014 A1 | 4/2008 | Adkisson |
| 2008/0090401 A1 | 4/2008 | Bratkovski |
| 2008/0092938 A1 | 4/2008 | Majumdar |
| 2008/0096308 A1 | 4/2008 | Santori |
| 2008/0108170 A1 | 5/2008 | Adkisson |
| 2008/0116537 A1 | 5/2008 | Adkisson |
| 2008/0128760 A1 | 6/2008 | Jun |
| 2008/0137188 A1 | 6/2008 | Sato et al. |
| 2008/0143906 A1 | 6/2008 | Allemand et al. |
| 2008/0145965 A1 | 6/2008 | Reznik |
| 2008/0149914 A1 | 6/2008 | Samuelson |
| 2008/0149944 A1 | 6/2008 | Samuelson |
| 2008/0157253 A1 | 7/2008 | Starikov |
| 2008/0166883 A1 | 7/2008 | Liu |
| 2008/0169017 A1 | 7/2008 | Korevaar |
| 2008/0169019 A1 | 7/2008 | Korevaar |
| 2008/0173615 A1 | 7/2008 | Kim |
| 2008/0178924 A1 | 7/2008 | Kempa |
| 2008/0188029 A1 | 8/2008 | Rhodes |
| 2008/0191278 A1 | 8/2008 | Maekawa |
| 2008/0191298 A1 | 8/2008 | Lin |
| 2008/0211945 A1 | 9/2008 | Hong |
| 2008/0218740 A1 | 9/2008 | Williams |
| 2008/0224115 A1 | 9/2008 | Bakkers |
| 2008/0225140 A1 | 9/2008 | Raynor |
| 2008/0233280 A1 | 9/2008 | Blanchet |
| 2008/0237568 A1 | 10/2008 | Kobayashi |
| 2008/0246020 A1 | 10/2008 | Kawashima |
| 2008/0246123 A1 | 10/2008 | Kamins |
| 2008/0248304 A1 | 10/2008 | Hanrath |
| 2008/0251780 A1 | 10/2008 | Li |
| 2008/0258747 A1 | 10/2008 | Kluth |
| 2008/0260225 A1 | 10/2008 | Szu |
| 2008/0264478 A1 | 10/2008 | Ahn |
| 2008/0266556 A1 | 10/2008 | Kamins |
| 2008/0266572 A1 | 10/2008 | Kamins |
| 2008/0271783 A1 | 11/2008 | Murakami |
| 2008/0277646 A1 | 11/2008 | Kim |
| 2008/0283728 A1 | 11/2008 | Inoue |
| 2008/0283883 A1 | 11/2008 | Shim |
| 2008/0297281 A1 | 12/2008 | Ayazi |
| 2008/0311693 A1 | 12/2008 | Maxwell |
| 2008/0311712 A1 | 12/2008 | Anwar |
| 2009/0001498 A1 | 1/2009 | Wang |
| 2009/0020150 A1 | 1/2009 | Atwater |
| 2009/0020687 A1 | 1/2009 | Lehmann et al. |
| 2009/0032687 A1 | 2/2009 | Lapstun |
| 2009/0046362 A1 | 2/2009 | Guo |
| 2009/0046749 A1 | 2/2009 | Mizuuchi |
| 2009/0050204 A1 | 2/2009 | Habib |
| 2009/0052029 A1 | 2/2009 | Dai et al. |
| 2009/0057650 A1 | 3/2009 | Lieber |
| 2009/0072145 A1 | 3/2009 | Peczalski |
| 2009/0104160 A1 | 4/2009 | Young |
| 2009/0120498 A1 | 5/2009 | Yamazaki |
| 2009/0121136 A1 | 5/2009 | Gruss |
| 2009/0127442 A1 | 5/2009 | Lee |
| 2009/0146198 A1 | 6/2009 | Joe |
| 2009/0151782 A1 | 6/2009 | Ko |
| 2009/0152664 A1 | 6/2009 | Klem |
| 2009/0153961 A1 | 6/2009 | Murakami |
| 2009/0165844 A1 | 7/2009 | Dutta |
| 2009/0173976 A1 | 7/2009 | Augusto |
| 2009/0179225 A1 | 7/2009 | Fertig |
| 2009/0179289 A1 | 7/2009 | Park |
| 2009/0188552 A1 | 7/2009 | Wang |
| 2009/0189144 A1* | 7/2009 | Quitoriano ........ H01L 27/14647 257/12 |
| 2009/0189145 A1 | 7/2009 | Wang |
| 2009/0194160 A1 | 8/2009 | Chin |
| 2009/0199597 A1 | 8/2009 | Danley |
| 2009/0201400 A1 | 8/2009 | Zhang |
| 2009/0206405 A1 | 8/2009 | Doyle |
| 2009/0223558 A1 | 9/2009 | Sun |
| 2009/0224245 A1 | 9/2009 | Umezaki |
| 2009/0224349 A1 | 9/2009 | Gambino |
| 2009/0230039 A1 | 9/2009 | Hoenig |
| 2009/0233445 A1 | 9/2009 | Lee |
| 2009/0242018 A1 | 10/2009 | Ahn |
| 2009/0243016 A1 | 10/2009 | Kawahara |
| 2009/0244514 A1 | 10/2009 | Jin |
| 2009/0260687 A1 | 10/2009 | Park |
| 2009/0261438 A1 | 10/2009 | Choi |
| 2009/0266418 A1 | 10/2009 | Hu |
| 2009/0266974 A1 | 10/2009 | Verhulst |
| 2009/0272423 A1 | 11/2009 | Niira |
| 2009/0278998 A1 | 11/2009 | El-Ghoroury |
| 2009/0289320 A1 | 11/2009 | Cohen |
| 2009/0305454 A1 | 12/2009 | Cohen |
| 2010/0006817 A1 | 1/2010 | Ohlsson |
| 2010/0019252 A1 | 1/2010 | Bratkovski |
| 2010/0019296 A1 | 1/2010 | Cha |
| 2010/0019355 A1 | 1/2010 | Kamins |
| 2010/0025710 A1 | 2/2010 | Yamada |
| 2010/0078055 A1 | 4/2010 | Vidu |
| 2010/0090341 A1 | 4/2010 | Wan |
| 2010/0101633 A1 | 4/2010 | Park |
| 2010/0104494 A1 | 4/2010 | Meng |
| 2010/0110433 A1 | 5/2010 | Nedelcu et al. |
| 2010/0116976 A1 | 5/2010 | Wober |
| 2010/0126573 A1 | 5/2010 | Youtsey |
| 2010/0127153 A1 | 5/2010 | Agarwal |
| 2010/0132779 A1 | 6/2010 | Hong |
| 2010/0133986 A1 | 6/2010 | Kim |
| 2010/0136721 A1 | 6/2010 | Song |
| 2010/0148221 A1 | 6/2010 | Yu |
| 2010/0163714 A1 | 7/2010 | Wober |
| 2010/0163941 A1 | 7/2010 | Jung |
| 2010/0178018 A1 | 7/2010 | Augusto |
| 2010/0186809 A1 | 7/2010 | Samuelson |
| 2010/0187404 A1 | 7/2010 | Klem |
| 2010/0200065 A1 | 8/2010 | Choi |
| 2010/0207103 A1 | 8/2010 | Farrow |
| 2010/0218816 A1 | 9/2010 | Guha |
| 2010/0229939 A1 | 9/2010 | Shen |
| 2010/0230653 A1 | 9/2010 | Chen |
| 2010/0237454 A1 | 9/2010 | Fujisawa |
| 2010/0240104 A1 | 9/2010 | Zhang |
| 2010/0244108 A1 | 9/2010 | Kohnke |
| 2010/0244169 A1 | 9/2010 | Maeda |
| 2010/0249877 A1 | 9/2010 | Naughton |

(56) References Cited

U.S. PATENT DOCUMENTS

| | | |
|---|---|---|
| 2010/0258184 A1 | 10/2010 | Laughlin |
| 2010/0276572 A1 | 11/2010 | Iwabuchi |
| 2010/0277607 A1 | 11/2010 | Choi |
| 2010/0282314 A1 | 11/2010 | Coakley |
| 2010/0295019 A1 | 11/2010 | Wang |
| 2010/0302440 A1 | 12/2010 | Wober |
| 2010/0304061 A1 | 12/2010 | Ye |
| 2010/0308214 A1 | 12/2010 | Wober |
| 2010/0313952 A1 | 12/2010 | Coakley |
| 2010/0319763 A1 | 12/2010 | Park |
| 2010/0320444 A1 | 12/2010 | Dutta |
| 2011/0018424 A1 | 1/2011 | Takada |
| 2011/0036396 A1 | 2/2011 | Jayaraman |
| 2011/0037133 A1 | 2/2011 | Su |
| 2011/0049572 A1 | 3/2011 | Jeon et al. |
| 2011/0050042 A1 | 3/2011 | Choi |
| 2011/0057231 A1 | 3/2011 | Jeon et al. |
| 2011/0057234 A1 | 3/2011 | Jeon et al. |
| 2011/0057286 A1 | 3/2011 | Jeon et al. |
| 2011/0080508 A1 | 4/2011 | Katsuno |
| 2011/0084212 A1 | 4/2011 | Clark |
| 2011/0127490 A1 | 6/2011 | Mi |
| 2011/0133060 A1 | 6/2011 | Yu |
| 2011/0133160 A1 | 6/2011 | Yu |
| 2011/0135814 A1 | 6/2011 | Miyauchi |
| 2011/0139176 A1 | 6/2011 | Cheung |
| 2011/0146771 A1 | 6/2011 | Chuang |
| 2011/0147870 A1 | 6/2011 | Ang |
| 2011/0180894 A1 | 7/2011 | Samuelson |
| 2011/0195577 A1 | 8/2011 | Kushibiki |
| 2011/0220191 A1 | 9/2011 | Flood |
| 2011/0226937 A1 | 9/2011 | Yu |
| 2011/0248315 A1 | 10/2011 | Nam |
| 2011/0249219 A1 | 10/2011 | Evans |
| 2011/0249322 A1 | 10/2011 | Wang |
| 2011/0253982 A1 | 10/2011 | Wang |
| 2011/0272014 A1 | 11/2011 | Mathai |
| 2011/0297214 A1 | 12/2011 | Kim |
| 2011/0309237 A1 | 12/2011 | Seo et al. |
| 2011/0309240 A1 | 12/2011 | Yu et al. |
| 2011/0309331 A1 | 12/2011 | Yu |
| 2011/0315988 A1 | 12/2011 | Yu |
| 2011/0316106 A1 | 12/2011 | Kim |
| 2012/0006390 A1 | 1/2012 | Huo et al. |
| 2012/0009714 A1 | 1/2012 | Mouli |
| 2012/0014837 A1 | 1/2012 | Fehr et al. |
| 2012/0029328 A1 | 2/2012 | Shimizu |
| 2012/0031454 A1 | 2/2012 | Fogel |
| 2012/0060905 A1 | 3/2012 | Fogel |
| 2012/0075513 A1 | 3/2012 | Chipman et al. |
| 2012/0153124 A1 | 6/2012 | Yu |
| 2012/0192939 A1 | 8/2012 | Tamboli et al. |
| 2012/0196383 A1 | 8/2012 | Nitkowski et al. |
| 2012/0196401 A1 | 8/2012 | Graham |
| 2012/0240999 A1 | 9/2012 | Yoshida |
| 2012/0258563 A1 | 10/2012 | Ogino |
| 2012/0280345 A1 | 11/2012 | Zhu |
| 2012/0298843 A1 | 11/2012 | Yu |
| 2012/0313078 A1 | 12/2012 | Fukui |
| 2012/0318336 A1 | 12/2012 | Hekmatshoar-Tabari et al. |
| 2012/0322164 A1 | 12/2012 | Lal |
| 2013/0000704 A1 | 1/2013 | Fogel |
| 2013/0020620 A1 | 1/2013 | Wober |
| 2013/0037100 A1 | 2/2013 | Platzer Bjorkman |
| 2013/0112256 A1 | 5/2013 | Yu |
| 2013/0125965 A1 | 5/2013 | Hazeghi et al. |
| 2013/0174904 A1 | 7/2013 | Yamasaki |
| 2013/0220406 A1 | 8/2013 | Day |
| 2013/0341749 A1 | 12/2013 | Yu et al. |
| 2014/0045209 A1 | 2/2014 | Chou |
| 2014/0096816 A1 | 4/2014 | Atwater et al. |
| 2014/0117401 A1 | 5/2014 | Herner |

FOREIGN PATENT DOCUMENTS

| | | |
|---|---|---|
| CN | 100350429 | 11/2007 |
| CN | 101221993 | 7/2008 |
| CN | 101459185 | 6/2009 |
| CN | 100568516 | 12/2009 |
| CN | 101675522 | 3/2010 |
| CN | 101681941 | 3/2010 |
| CN | 103201858 | 7/2013 |
| EP | 1367819 | 12/2003 |
| EP | 0809303 B1 | 9/2006 |
| FR | 2923651 | 5/2009 |
| GB | 2348399 A | 4/2000 |
| JP | 359013708 A | 1/1984 |
| JP | 59198413708 | 1/1984 |
| JP | 2000324396 | 11/2000 |
| JP | 2002151715 A | 5/2002 |
| JP | 2005252210 A | 9/2005 |
| JP | 2005328135 | 11/2005 |
| JP | 2007134562 | 5/2007 |
| JP | 2007152548 | 6/2007 |
| JP | 2007184566 | 7/2007 |
| JP | 2007520877 | 7/2007 |
| JP | 2007201091 | 8/2007 |
| JP | 2007317961 | 12/2007 |
| JP | 2008288585 | 11/2008 |
| JP | 2009506546 | 2/2009 |
| JP | 2009236914 | 10/2009 |
| JP | 2012543250 | 4/2013 |
| JP | 2013513253 | 4/2013 |
| JP | 2013513254 | 4/2013 |
| TW | I318418 | 5/2004 |
| TW | I228782 | 3/2005 |
| TW | 200535914 | 11/2005 |
| TW | 200536048 | 11/2005 |
| TW | 200742115 | 4/2007 |
| TW | 200810100 | 2/2008 |
| TW | 200814308 | 3/2008 |
| TW | 200845402 | 11/2008 |
| TW | 200847412 | 12/2008 |
| TW | 200915551 | 4/2009 |
| TW | 200941716 | 10/2009 |
| TW | I320235 | 2/2010 |
| TW | 201027730 | 7/2010 |
| TW | 201034172 | 9/2010 |
| TW | 201044610 | 12/2010 |
| TW | 201140859 | 11/2011 |
| WO | 8603347 A1 | 6/1986 |
| WO | 0002379 | 1/2000 |
| WO | 02069623 | 9/2002 |
| WO | 03107439 | 12/2003 |
| WO | 03107439 A1 | 12/2003 |
| WO | 2005064337 | 7/2005 |
| WO | 2007000879 | 1/2007 |
| WO | 2008069565 | 6/2008 |
| WO | 2008079076 | 7/2008 |
| WO | 2008079076 A1 | 7/2008 |
| WO | 2008131313 A2 | 10/2008 |
| WO | 2008135905 | 11/2008 |
| WO | 2008135905 A2 | 11/2008 |
| WO | 2008135905 A3 | 11/2008 |
| WO | 2008143727 A2 | 11/2008 |
| WO | 20080131313 | 12/2008 |
| WO | 2009099841 | 8/2009 |
| WO | 2009116018 A2 | 9/2009 |
| WO | 2009137241 A2 | 11/2009 |
| WO | 2010014099 | 2/2010 |
| WO | 2010019887 A1 | 2/2010 |
| WO | 2010039631 A1 | 4/2010 |
| WO | 2010067958 | 8/2010 |
| WO | 2011074457 | 6/2011 |

OTHER PUBLICATIONS

Philipp, H.R. et al., "Optical Constants of Silicon in the Region 1 to 10 ev", Physical Review, vol. 120, No. 1, pp. 37-38.

Office Action for U.S. Appl. No. 13/543,307 mailed Apr. 17, 2015.

(56) References Cited

OTHER PUBLICATIONS

Office Action issued on Mar. 18, 2015 in Chinese Application No. 201180066970.6.
Office Action issued Mar. 19, 2015 in Chinese Application No. 201180065814.8.
Office Action for U.S. Appl. No. 13/693,207 mailed May 7, 2015.
Office Action for U.S. Appl. No. 13/288,131 mailed Apr. 17, 2015.
Office Action issued Apr. 3, 2015 in Chinese Application No. 201180051048.X.
Office Action issued May 15, 2015 in U.S. Appl. No. 14/274,448.
Office Action for U.S. Appl. No. 12/982,269 mailed May 22, 2015.
Philipp, H.R. et al., "Optical Constants of Silicon in the Region 1 to 10 ev", Physical Review, vol. 120, No. 1, pp. 37-38, Oct. 1, 1960.
Kosonocky, et al., 160×244 Element PtSi Schottky-Barrier IR-CCD Image Sensor, IEEE Transactions on Electron Devices, vol. Ed-32, No. 8, Aug. 1985.
Office Action issued May 22, 2015 in Taiwanese Application No. 099142971.
Office Action mailed May 26, 2015 in Japanese Application No. 2014 138265.
Office Action for U.S. Appl. No. 14/068,864 mailed Jun. 15, 2015.
Office Action issued on May 5, 2015 in Chinese Application No. 201410264248.9.
Office Action issued Jul. 9, 2015 in Taiwanese Application No. 102124069.
A. Gu et al., "Design and growth of III-V nanowire solar cell arrays on low cost substrates," Conf. Record, 35rd IEEE Photovoltaic Specialists Conference, Honolulu, Jun. 2010, pp. 20-25.
Office Action issued Jun. 23, 2015 in Chinese Application No. 201310284409.6.
Office Action issued Aug. 12, 2015 in Chinese Application No. 201180054442.9.
Office Action mailed Sep. 30, 2015 in Japanese Application No. 2014-094365.
Office Action for U.S. Appl. No. 12/966,514 mailed Nov. 2, 2015.
Office Action for U.S. Appl. No. 12/633,313 mailed Oct. 21, 2015.
Office Action for U.S. Appl. No. 13/963,847 mailed Sep. 1, 2015.
Office Action for U.S. Appl. No. 12/945,492 mailed Sep. 9, 2015.
Office Action for U.S. Appl. No. 14/459,398 mailed Sep. 16, 2015.
Office Action for U.S. Appl. No. 14/274,448 mailed Aug. 26, 2015.
Office Action for U.S. Appl. No. 13/288,131 mailed Oct. 22, 2015.
Office Action for U.S. Appl. No. 14/450,812 mailed Oct. 28, 2015.
Office Action for U.S. Appl. No. 12/945,429 mailed Sep. 4, 2015.
Office Action dated Oct. 6, 2015 in Taiwanese Application No. 100141376.
Office Action dated Sep. 11, 2015 in Taiwanese Application No. 103143553.
International Search Report and Written Opinion mailed Nov. 27, 2015 in International Application No. PCT/US2015/038999.
CMOS image sensor pixel microlens array optimization using FDTD Solutions, http://www.lumerical_com/fdtd_microlens/cmos_image_sensor_pixel_microlens.php, pp. 1-2, Jun. 25, 2008.
Adler, Nanowire Lawns Make for Sheets of Image Sensors, NewScientist.com, Jul. 28, 2008.
Babinec et al., High-Flux, Low-Power Diamond Nanowire Single-Photon Source Arrays: An Enabling Material for Optical and Quantum Computing and Cryptography, obtained on Jul. 22, 2010 at URL: http://otd.harvard.edu/technologies/tech.php?case=3702.
Baillie et al., 'Zero-space microlenses for CMOS image sensors: optical modeling and lithographic process development', Publication Date May 2004, http://adsabs.harvard.edu/abs/2004SPIE.5377..953B, pp. 1-2.
Barclay et al., Chip-Based Microcavities Coupled to NV Centers in Single Crystal Diamond, Applied Physics Letters, Nov. 12, 2009, vol. 95, Issue 19.
Brouri et al., Photon Antibunching in the Flurescence of Individual Colored Centers in Diamond, Optics Letters, Sep. 1, 2000, vol. 25, Issue 17.
Chung, Sung-Wook et al. Silicon Nanowire Devices. Applied Physics Letters, vol., 76, No. 15 (Apr. 10, 2000), pp. 2068-2070.
CMOS image sensor pixel optical efficiency and optical crosstalk optimization using FDTD Solutions www.lumerical.com/fdtd_microlens/cmos_image_sensor_pixel_microlens.php, Mar. 19, 2009.
Deptuch et al., Vertically Integrated Circuits at Fermilab, IEEE Transactions on Nuclear Science, Aug. 2010, vol. 54, Issue 4, pp. 2178-2186.
Ekroll, On the Nature of Simultaneous Color Contrast, Dissertation, University of Kiel, 2005.
Fan et al., Large-Scale, Heterogeneous Integration of Nanowire Arrays for Image Sensor Circuitry, Proceedings of the National Academy of Sciences (PNAS) of the United States of America, Aug. 12, 2008, vol. 105, No. 32.
Fang et al., Fabrication of Slantingly-Aligned Silicon Nanowire Arrays for Solar Cell Applications, Nanotechnology, vol. 19, No. 25. 2008.
Furumiya, et al. 'High-sensitivity and no-crosstalk pixel technology for embedded CMOS image sensor'; IEEE Electron Device Letters, vol. 48, No. 10, Oct. 2001.
Gadelrab et al., The Source-Gated Amorphous Silicon Photo-Transistor, IEEE Transactions on Electron Devices, Oct. 1997, vol. 44, No. 10, pp. 1789-1794.
Gambino et al., 'CMOS Imager with Copper Wiring and Lightpipe,' Electron Devices Meeting, 2006. IEDM '06, International Publication Date: Dec. 11-13, 2006, pp. 1-4.
Garnett et al., Light Trapping in Silicon Nanowire Solar Cells, Nanoletters, Jan. 28, 2010, vol. 10, No. 3, pp. 1082-1087.
Ge et al., Orientation-Controlled Growth of Single-Crystal Silicon-Nanowire Arrays, Advanced Materials, Jan. 18, 2005, vol. 17, No. 1, pp. 56-61.
Guillaumee, et al.; Polarization Sensitive Silicon Photodiodes Using Nanostructured Metallic Grids, Applied Physics Letters 94, 2009.
Hanrath et al., Nucleation and Growth of Germanium Nanowires Seeded by Organic Monolayer-Coated Gold Nanocrystals, J. Am. Chem. Soc., Feb. 20, 2002, vol. 124, No. 7, pp. 1424-1429.
Hanrath et al., Supercritical Fluid-Liquid-Solid (SFLS) Synthesis of Si and Ge Nanowires Seeded by Colloidal Metal Nanocrystals, Advanced Materials, Mar. 4, 2003, vol. 15, No. 5, pp. 437-440.
Hochbaum et al., Controlled Growth of Si Nanowire Arrays for Device Integration, Nano Letters, Mar. 2005, vol. 5, No. 3, pp. 457-460.
Holmes et al., Control of Thickness and Orientation of Solution-Grown Silicon Nanowires, Science, Feb. 25, 2000, vol. 287, No. 5457, pp. 1471-1473.
Hsu, et al. 'Light Guide for Pixel Crosstalk Improvement in Deep Submicron CMOS Image Sensor'; IEEE Electron Device Letters, vol. 25, No. 1, Jan. 2004.
International Preliminary Report on Patentability for PCT International Application No. PCT/US2010/035722, mailed Nov. 3, 2011.
International Preliminary Report on Patentability for PCT International Patent Application No. PCT/U62009/055963, mailed Mar. 17, 2011.
International Search Report and Written Opinion for PCT International Application No. PCT/US2010/035722, mailed Jul. 20, 2010.
International Search Report and Written Opinion for PCT International Application No. PCT/US2010/035726, mailed Jul. 21, 2010.
International Search Report and Written Opinion for PCT International Patent Application No. PCT/US2009/055963, mailed Oct. 15, 2009.
International Search Report and Written Opinion for PCT International Patent Application No. PCT/US2009/063592, mailed Jan. 13, 2010.
International Search Report and Written Opinion for PCT International Patent Application No. PCT/US2010/035727, mailed Sep. 27, 2010.
International Search Report and Written Opinion for PCT International Patent Application No. PCT/US2010/051435, mailed Dec. 3, 2010.
International Search Report and Written Opinion for PCT International Patent Application No. PCT/US2010/051446, mailed Jan. 3, 2011.

(56) References Cited

OTHER PUBLICATIONS

International Search Report and Written Opinion for PCT International Patent Application No. PCT/US2010/057227, mailed Jan. 26, 2011.
International Search Report and Written Opinion for PCT International Patent Application No. PCT/US2010/059468, mailed Feb. 11, 2011.
International Search Report and Written Opinion for PCT International Patent Application No. PCT/US2010/059491, mailed Feb. 9, 2011.
International Search Report and Written Opinion for PCT International Patent Application No. PCT/US2010/059501, mailed Feb. 15, 2011.
International Search Report and Written Opinion for PCT International Patent Application No. PCT/US2010/059504, mailed Apr. 7, 2011.
International Search Report and Written Opinion for PCT International Patent Application No. PCT/US2011/060348, mailed Mar. 9, 2012.
International Search Report and Written Opinion for PCT International Patent Application No. PCT/US2011/064635, mailed Apr. 13, 2012.
International Search Report and Written Opinion for PCT International Patent Application No. PCT/US2011/066097, mailed Mar. 12, 2012.
International Search Report and Written Opinion for PCT International Patent Application No. PCT/US2011/067712, mailed May 3, 2012.
Jin-Kon Kim; 'New Functional Nanomaterials Based on Block Copolymers' http://www.ziu.edu.cn/adver/subjectizyhd/jz0707061313.html, Jul. 11, 2007.
Juan et al., High Aspect Ratio Polymide Etching Using an Oxygen Plasma Generated by Electron Cyclotron Resonance Source, Journal of Vacuum Science and Technology, Jan./Feb. 1994, vol. 12, No. 1., pp. 422-426.
Junger, et al., Polarization- and wavelength-sensitive sub-wavelength structures fabricated in the metal layers of deep submicron CMOS processes, Proc. of SPIE, vol. 7712, 2010.
Kalkofen et al., Atomic Layer Deposition of Boron Oxide as Dopant Source for Shallow Dopant Source for Shallow Doping Silicon, Meeting Abstract 943, 217th ECS Meeting MP2010-O1 , Apr. 25-30, 2010 Vancouver Canada, El—Advanced Gate Stack, Source / Drain, and Channel Engineering for Si-Based CMOS 6: New Materials, Processes,and Equipment.
Kane, Why Nanowires Make Great Photodetectors, EurekAlert.com article, Apr. 25, 2007.
Kempa, Thomas J. et al. Single and Tandem Axial p-i-n Nanowire Photovoltaic Devices, Nano Letters, 2008, vol. 8, No. 10, 3456-3460.
Kim et al., Electronic Structure of Vertically Aligned Mn-Doped CoFe2O4 Nanowires and Their Application as Humidity Sensors and Photodetectors, Journal of Physical Chemistry C, Apr. 7, 2009.
Law et al., Semiconductor Nanowires and Nanotubes, Annu. Rev. Mater. Res., 2004, vol. 34, pp. 83-122.
Lee et al., Vertical Pillar-Superlattice Array and Graphene Hybrid Light Emitting Diodes, Nano Letters, 2010, vol. 10, pp. 2783-2788.
Lin et al., Fabrication of Nanowire Anisotropic Conductive Film for Ultra-fine Pitch Flip Chip Interconnection, Electronic Components and Technology Conference, Jun. 20, 2005, 55th Proceedings, pp. 66-70.
Lin et al., Reducing Dark Current in a High-Speed Si-Based Interdigitated Trench-Electrode MSM Photodetector, IEEE Transactions on Electron Devices, May 2003, vol. 50, No. 5, pp. 1306-1313.
Loncar et al., Diamond Nanotechnology, SPIE Newsroom, May 18, 2010, obtained at url: http://spie.org/x40194.xml?ArticleID=x40194.
Loose et al., CMOS Detector technology, Scientific Technology, Scientific Detector Workshop, Sicily 2005, Experimental Astronomy, vol. 19, Issue 1-3, pp. 111-134.
Lu et al., Growth of Single Crystal Silicon Nanowires in Supercritical Solution from Tethered Gold Particles on a Silicon Substrate, NanoLetters, Jan. 2003, vol. 3, No. 1, pp. 93-99.
Lugstein et al., Ga/Au Alloy Catalyst for Single Crystal Silicon-Nanowire Epitaxy, Applied Physics Letters, Jan. 8, 2007, vol. 90, No. 2, pp. 023109-1-023109-3.
Madou, Properties and Growth of Silicon, Including Crystalline Silicon, Fundamentals of Microfabrication, 2nd Ed., Press, 2002, pp. 125-204. CRC.
Makarova et al., Fabrication of High Density, High-Aspect-Ratio Polyimide Nanofilters, Journal of Vacuum Science and Technology, Nov./Dec. 2009, vol. 27, No. 6., pp. 2585-2587.
Morales et al., A Laser Ablation Method for the Synthesis of Crystalline Semiconductor Nanowires, Science, Jan. 9, 1998, vol. 279, pp. 208-211.
N. L. Dmitruk, et al.; 'Modeling and Measurement of Optical Response of 1D Array of Metallic Nanowires for Sensing and Detection Application'; 26th International Conference on Microelectronics (MIEL 2008), NIS, Serbia, May 11-14, 2008.
Nguyen et al., Deep Reactive Ion etching of Polyimide for Microfluidic Applications, Journal of the Korean Physical Society, Sep. 2007, vol. 51, No. 3, pp. 984-988.
Ozgur Yavuzcetin, et al.; 'Index-tuned Anti-reflective Coating using a Nanostructured Metamaterial'; http://www.umass.edu/research/rld/bioportal/vuewtech.php?tid=40, Feb. 28, 2007.
Pain et al., A Back-Illuminated Megapixel CMOS Image Sensor, IEEE Workshop on Charge-Coupled Devices and Advanced Image Sensors, Karuizawa, Japan, Jun. 9-11, 2005, Jet Propulsion Laboratory, National Aeronautics and Space Administration, Pasadena California.
Parraga et al., Color and Luminance Information in Natural Scenes, Journal of Optical Society of America A, Optics, Image, Science and Vision, Jun. 1998, vol. 15, No. 6.
Reynard Corporation; 'Anti-Reflection Coatings (AR)', http://www.reynardcorp.com/coating_anti_reflection.php, dowwnloaded Jun. 4, 2009.
Rosfjord et al., Nanowire Single-Photon Detector with an Integrated Optical Cavity and Anti-Reflection Coating, Optics Express: The International Electronic Journal of Optics; Jan. 23, 2006, vol. 14, No. 2, pp. 527-534.
Rugani, First All-Nanowire Sensor, Technology Review, Aug. 13, 2008, Published by MIT.
Rutter, Diamond-Based Nanowire Devices Advance Quantum Science, SEAS Communications, Feb. 14, 2010, obtained at url:http://news.harvard.edu/gazette/story/2010/02/digging-deep-into-diamonds/.
Sarkar et al., Integrated polarization-analyzing CMOS image sensor for detecting incoming light ray direction, Sensors Application Symposium (SAS), Mar. 29, 2012, p. 194-199, 1010 IEEE.
Schmidt et al., Realization of a Silicon Nanowire Vertical Surround-Gate Field-Effect Effect Transistor, Small, Jan. 2006, vol. 2, No. 1, pp. 85-88.
Shimizu et al., Homoepitaxial Growth of Vertical Si Nanowires on Si(100) Substrate using Anodic Aluminum Oxide Template, (abstract only), Materials Research Society, Fall 2007.
Shockley, et al., Detailed Balance Limit of Efficiency of p-n Junction Solar Cells, J. of Appl. Physics, vol. 32, No. 3, Mar. 1961, 10 pages.
Song et al., Vertically Standing Ge Nanowires on GaAs(110) Substrates, Nanotechnology 19, Feb. 21, 2008.
Thelander et al., Nanowire-Based One-Dimensional Electronics, Materials Today, Oct. 2006, vol. 9, No. 10, pp. 28-35.
Trentler, Timothy J. et al. Solution-Liquid-Solid Growth of Cyrstalline III-V Semiconductors: An Analogy to Vapor Liquid-Solid Growth. vol. 270(5243), Dec. 15, 1995, pp. 1791-1794.
Tseng, et al. Crosstalk improvement technology applicable to 0.14m CMOS image sensor; IEEE International Electron Devices Meeting, Dec. 13-15, 2004; IEDM Technical Digest, pp. 997-1000.
Verheijen, Marcel A. et al. Growth Kinetics of Heterostructured GaP-GaAs Nanowires. J. Am, Chem. Soc. 2006, 128, 1353-1359.
Wagner et al., Vapor-Liquid-Solid Mechanism of Single Crystal Growth, Applied Physics Letters, Mar. 1, 1964, vol. 4, No. 5, pp. 89-90.

(56) References Cited

OTHER PUBLICATIONS

Wang, Introduction to Nanotechnology—Where Opportunities arise & Great Future Being Built from Small Things, Fall 2008.
Wong et al., Lateral Nanoconcentrator Nanowire Multijunction Photovoltaic Cells, GCEP Progress report, Apr. 20, 2009, pp. 1-18.
Ye et al., Fabrication Techniques of High Aspect Ratio Vertical Lightpipes Using a Dielectric Photo Mask, SPIE, Proceedings, Feb. 2010, vol. 7591.
Zhang et al., Ultrahigh Responsivity Visible and Infrared Detection Using Silicon Nanowire Phototransistors, Nanoletters, May 14, 2010, vol. 10, No. 6, pp. 2117-2120.
Baomin, et al., Nanotechology 23 (2012) 194003, 7 pages.
International Preliminary Report and Written Opinion re PCT/US2010/059468, mailed Jun. 21, 2012.
International Preliminary Report and Written Opinion re PCT/US2010/059491, mailed Jun. 21, 2012.
International Preliminary Report and Written Opinion re PCT/US2010/059496, mailed Jun. 21, 2012.
International Search Report and Written Opinion re PCT/US2011/57325, mailed Jun. 22, 2012.
Jeong, et al., Nano Lett. 2012, 12, 2971-2976.
Jeong et al., J. Vac. Sci. Technol. A 30(6), Nov./Dec. 2012.
Office Action issued on Mar. 3, 2014 in Chinese Application No. 200980142671.9.
U.S. Final Office Action for U.S. Appl. No. 12/966,514, mailed Mar. 19, 2013, 50 pages.
U.S. Final Office Action for U.S. Appl. No. 13/494,661, mailed Mar. 7, 2013, 10 pages.
U.S. Office Action for U.S. Appl. No. 12/573,582, Examiner Robert Huber, dated Jun. 28, 2012.
U.S. Office Action for U.S. Appl. No. 13/494,661 by Examiner Thanh X. Luu, notification date Nov. 7, 2012.
Canadian Office Action of Canadian Application No. 3,676,376, dated Oct. 11, 2013.
Catrysse, et al., An Integrated Color Pixel in 0.18pm CMOS Technology, Proceedings IEDM 2001, pp. 559-562.
Choi et al., Optimization of sidewall roughness in silica waveguides to reduce propagation losses, May 2001, Lasers and Electro-Optics, 2001. CLEO '01. Technical Digest. Summaries of papers presented at the Conference on, pp. 175-176.
Geyer et al., Model for the Mass Transport during Metal-Assisted Chemical Etching with Contiguous Metal Films as Catalysts, J. Phys. Chem. C 2012, 116, 13446-13451.
Hopkins, Addressing sidewall roughness using dry etching silicon and Si02, Jul. 1, 2004, ElectroIQ, vol. 47, Issue 7.
International Preliminary Search Report on Patentability of PCT/US2011/057325, mailed May 2, 2013 (9 pages).
Mei-Ling Kuo et al. "Realization of a near-perfect antireflection coating for silicon solar energy utilization" (Nov. 1, 2008, vol. 33, No. 21, Optics Letters).
Mukhopadhyay, When PDMS Isn't the Best, American Chemical Society, May 1, 2007.
Seo, et. al., "Multicolored vertical silicon nanowires," Nano Letters, vol. 11 issue 4, pp. 1851-1856, 2010.
Taiwanese Office Action of Taiwan Patent Application No. 099116881, issued Jul. 18, 2013 (8 pages).
U.S. Office Action for U.S. Appl. No. 12/633,313, dated Aug. 1, 2013, 20 pages.
U.S. Office Action for U.S. Appl. No. 12/966,514, dated Aug. 15, 2013, 17 pages.
U.S. Office Action for U.S. Appl. No. 12/966,535, mailed Jun. 14, 2013, 22 pages.
U.S. Office Action for U.S. Appl. No. 12/966,573, dated Aug. 6, 2013, 13 pages.
U.S. Office Action for U.S. Appl. No. 13/048,635, mailed Jun. 6, 2013, 24 pages.
Office Action issued on Jan. 28, 2014 in Taiwanese Application No. 100146327.
Office Action issued on Mar. 17, 2014 in Korean Application No. 10-2013-7018243.
U.S. Office Action for U.S. Appl. No. 12/910,664, mailed Feb. 26, 2014.
U.S. Office Action for U.S. Appl. No. 12/966,514, mailed Feb. 25, 2014.
Office Action issued on Jun. 19, 2014 in Taiwanese Application No. 099133891.
U.S. Office Action for U.S. Appl. No. 12/945,492 mailed May 13, 2014.
U.S. Office Action for U.S. Appl. No. 12/982,269 mailed Jun. 11, 2014.
U.S. Office Action for U.S. Appl. No. 13/106,851 mailed May 29, 2014.
U.S. Office Action for U.S. Appl. No. 13/556,041 mailed Jun. 12, 2014.
U.S. Office Action for U.S. Appl. No. 14/021,672 mailed May 9, 2014.
U.S. Office Action for U.S. Appl. No. 12/633,313 mailed Aug. 1, 2014.
U.S. Office Action for U.S. Appl. No. 13/693,207 mailed Oct. 9, 2014.
U.S. Office Action for U.S. Appl. No. 12/966,514 mailed Sep. 23, 2014.
Office Action issued on Jun. 24, 2014 in Taiwanese Application No. 098129911.
University of California San Diego, Class ECE 183 Lab 1, 2013.
Office Action issued on Oct. 29, 2014 in Korean Application No. 10-2013-7020107.
U.S. Office Action for U.S. Appl. No. 13/925,429 mailed Nov. 4, 2014.
Corrected Notice of Allowability issued on Oct. 14, 2014 in U.S. Appl. No. 12/966,535.
Notice of Allowance issued on Dec. 1, 2014 in U.S. Appl. No. 12/910,664.
U.S. Office Action for U.S. Appl. No. 13/543,307 mailed Dec. 24, 2014.
U.S. Office Action for U.S. Appl. No. 14/274,448 mailed Dec. 5, 2014.
International Search Report and Written Opinion for International Application No. PCT/US2014/056558 mailed Dec. 12, 2014.
Office Action issued on Nov. 11, 2014 in Taiwanese Application No. 098129911.
Notice of Allowance issued Jan. 30, 2015 in U.S. Appl. No. 14/487,375.
International Search Report and Written Opinion for International Application No. PCT/US2014/050544 mailed Jan. 9, 2015.
Office Action for U.S. Appl. No. 12/982,269, mailed Jan. 15, 2015.
Office Action for U.S. Appl. No. 12/945,492 mailed Jan. 16, 2015.
Office Action issued Feb. 23, 2015 in U.S. Appl. No. 13/925,429.
Office Action issued on Jan. 16, 2015 in Chinese Application No. 201180054442.9.
Bernstein et al. "Modern Physics", Chapter 14, Section 6, pp. 420-421, 2000 by Prentice-Hall Inc.
Office Action for U.S. Appl. No. 14/281,108 mailed Apr. 6, 2015.
Office Action for U.S. Appl. No. 13/963,847 mailed Mar. 12, 2015.
Office Action for U.S. Appl. No. 12/966,514 mailed Mar. 10, 2015.
Office Action issued on Mar. 4, 2015 in U.S. Appl. No. 13/556,041.
Office Action for U.S. Appl. No. 14/450,812 mailed Apr. 1, 2015.
Office Action for U.S. Appl. No. 12/633,313 mailed Apr. 9, 2015.
Office Action for U.S. Appl. No. 14/450,812 mailed Jul. 23, 2015.
Office Action for U.S. Appl. No. 14/293,164 mailed Aug. 14, 2015.
Office Action mailed Mar. 29, 2016 in Japanese Application No. 2014-138265.
International Preliminary Report on Patentability issued on Mar. 22, 2016 in International Application PCT/US2014/056558.
Decision issued on Jan. 30, 2016 in Taiwanese Application 099142971.
Office Action issued Apr. 21, 2016 in U.S. Appl. No. 14/322,503.
Office Action issued Apr. 14, 2016 in U.S. Appl. No. 14/704,143.
Office Action issued Apr. 27, 2016 in U.S. Appl. No. 14/291,888.
Office Action issued Apr. 6, 2016 in Taiwanese Application 100149997.
Decision issued Mar. 28, 2016 in Taiwanese Application 103143553.

(56) References Cited

OTHER PUBLICATIONS

Office Action issued Apr. 27, 2016 in Chinese Application 201410265340.7.
Office Action issued Apr. 29, 2016 in Chinese Application 201301284409.6.
Office Action issued Jun. 29, 2016 in Chinese Application 201280030352.0.
Office Action issued Jun. 16, 2016 in Taiwanese Application 100138526.
Office Action issued Jun. 17, 2016 in Chinese Application 201410264248.9.
Notice of Allowance mailed Aug. 30, 2016 in U.S. Appl. No. 14/291,888.
Office Action issued Aug. 22, 2016 in U.S. Appl. No. 14/450,812.
Office Action issued Oct. 22, 2015 in Taiwanese Application No. 103139449.
Office Action issued Oct. 16, 2015 in Taiwanese Application No. 103145582.
Office Action issued on Nov. 25, 2015 in Japanese Application No. 2015-005091.
Office Action issued Nov. 17, 2015 in Taiwanese Application 103102171.
Office Action issued Nov. 20, 2015 in Taiwanese Application 104108370.
Office Action issued on Nov. 27, 2015 in Taiwanese Application No. 100138526.
International Search Report and Written Opinion mailed Jan. 8, 2016 in International Application No. PCT/US2015/055728.
Office Action issued Jan. 4, 2016 in U.S. Appl. No. 14/311,954.
Office Action issued Jan. 5, 2016 in U.S. Appl. No. 14/291,888.
Office Action issued Nov. 9, 2015 in U.S. Appl. No. 14/503,598.
Office Action issued Jan. 4, 2016 in U.S. Appl. No. 14/293,164.
Office Action issued Jan. 7, 2016 in U.S. Appl. No. 14/322,503.
Office Action issued Jan. 14, 2016 in U.S. Appl. No. 14/459,398.
Office Action issued Dec. 28, 2015 in Taiwanese Application No. 102149110.
Office Action issued Dec. 25, 2015 in Chinese Application No. 201410264248.9.
Office Action issued Dec. 30, 2015 in Taiwanese Application No. 104123757.
International Search Report and Written Opinion mailed Nov. 27, 2015 in International Application PCT/US2015/038999.
Office Action issued Jan. 15, 2016 in Chinese Application No. 201180066970.6.
International Preliminary Report on Patentability issued Feb. 9, 2016 in International Application PCT/US2014/050544.
International Search Report and Written Opinion mailed Feb. 9, 2016 in International Application PCT/US2015/55710.
Office Action issued Feb. 25, 2016 in Chinese Application No. 201180051048.X.
Office Action issued Feb. 1, 2016 in Taiwanese Application 102124069.
Office Action issued Feb. 6, 2016 in Chinese Application No. 201180054442.9.
Office Action issued Feb. 4, 2016 in U.S. Appl. No. 14/274,448.
Office Action issued Mar. 7, 2016 in U.S. Appl. No. 14/450,812.

* cited by examiner

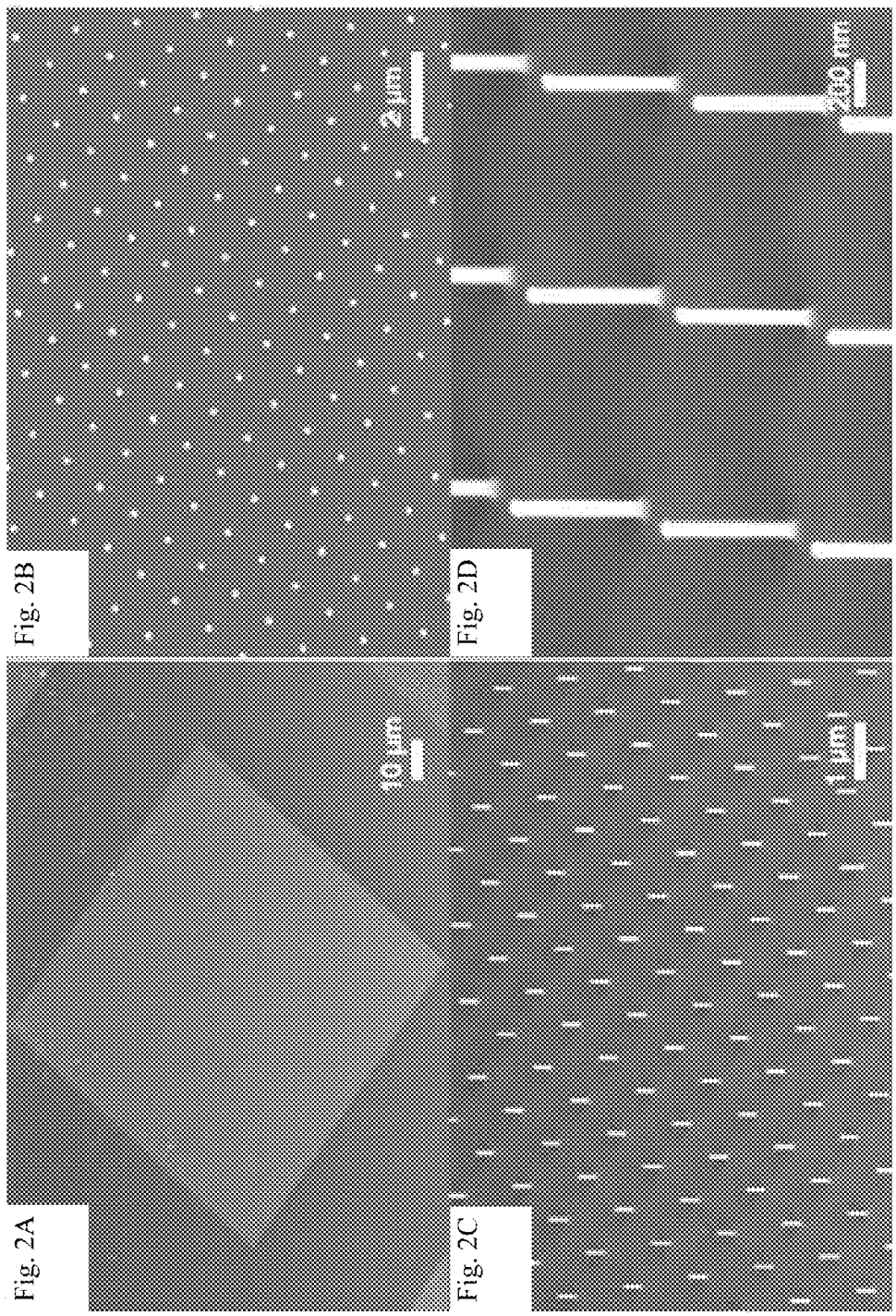

LIGHT ABSORPTION AND FILTERING PROPERTIES OF VERTICALLY ORIENTED SEMICONDUCTOR NANO WIRES

CROSS-REFERENCE TO RELATED APPLICATIONS

This application is a continuation of U.S. application Ser. No. 12/910,664, filed Oct. 22, 2010, which claims the benefit of U.S. Provisional Application No. 61/357,429, filed Jun. 22, 2010. This application is related to the disclosures of U.S. patent application Ser. No. 12/204,686, filed Sep. 4, 2008 (now U.S. Pat. No. 7,646,943, issued Jan. 12, 2010), Ser. No. 12/648,942, filed Dec. 29, 2009 (now U.S. Pat. No. 8,229,255, issued Jul. 24, 2012), Ser. No. 13/556,041, filed Jul. 23, 2012, Ser. No. 12/270,233, filed Nov. 13, 2008 (now U.S. Pat. No. 8,274,039, issued Sep. 25, 2012), Ser. No. 13/925,429, filed Jun. 24, 2013, Ser. No. 13/570,027, filed Aug. 8, 2012 (now U.S. Pat. No. 8,471,190, issued Jun. 25, 2013), Ser. No. 12/472,264, filed May 26, 2009 (now U.S. Pat. No. 8,269,985, issued Sep. 18, 2012), Ser. No. 13/621,607, filed Sep. 17, 2012 (now U.S. Pat. No. 8,514,411, issued Aug. 20, 2013), Ser. No. 13/971,523, filed Aug. 20, 2013 (now U.S. Pat. No. 8,810,808, issued Aug. 19, 2014), Ser. No. 12/472,271, filed May 26, 2009 (now abandoned), Ser. No. 12/478,598, filed Jun. 4, 2009 (now U.S. Pat. No. 8,546,742, issued Oct. 1, 2013), Ser. No. 14/021,672, filed Sep. 9, 2013, Ser. No. 12/573,582, filed Oct. 5, 2009 (now U.S. Pat. No. 8,791,470, issued Jul. 29, 2014), Ser. No. 14/274,448, filed May 9, 2014, Ser. No. 12/575,221, filed Oct. 7, 2009 (now U.S. Pat. No. 8,384,007, issued Feb. 26, 2013), Ser. No. 12/633,323, filed Dec. 8, 2009 (now U.S. Pat. No. 8,735,797, issued May 27, 2014), Ser. No. 14/068,864, filed Oct. 31, 2013, Ser. No. 14/281,108, filed May 19, 2014, Ser. No. 13/494,661, filed Jun. 12, 2012 (now U.S. Pat. No. 8,754,359, issued Jun. 17, 2014), Ser. No. 12/633,318, filed Dec. 8, 2009 (now U.S. Pat. No. 8,519,379, issued Aug. 27, 2013), Ser. No. 13/975,553, filed Aug. 26, 2013 (now U.S. Pat. No. 8,710,488, issued Apr. 29, 2014), Ser. No. 12/633,313, filed Dec. 8, 2009, Ser. No. 12/633,305, filed Dec. 8, 2009 (now U.S. Pat. No. 8,299,472, issued Oct. 30, 2012), Ser. No. 13/543,556, filed Jul. 6, 2012 (now U.S. Pat. No. 8,766,272, issued Jul. 1, 2014), Ser. No. 14/293,164, filed Jun. 2, 2014, Ser. No. 12/621,497, filed Nov. 19, 2009 (now abandoned), Ser. No. 12/633,297, filed Dec. 8, 2009 (now U.S. Pat. No. 8,889,455, issued Nov. 18, 2014), Ser. No. 12/982,269, filed Dec. 30, 2010, Ser. No. 12/966,573, filed Dec. 13, 2010 (now U.S. Pat. No. 8,866,065, issued Oct. 21, 2014), Ser. No. 12/967,880, filed Dec. 14, 2010 (now U.S. Pat. No. 8,748,799, issued Jun. 10, 2014), Ser. No. 14/291,888, filed May 30, 2014 Ser. No. 12/966,514, filed Dec. 13, 2010, Ser. No. 12/974,499, filed Dec. 21, 2010 (now U.S. Pat. No. 8,507,840, issued Aug. 13, 2013), Ser. No. 12/966,535, filed Dec. 13, 2010 (now U.S. Pat. No. 8,890,271, issued Nov. 18, 2014), Ser. No. 12/910,664, filed Oct. 22, 2010, Ser. No. 12/945,492, filed Nov. 12, 2010, Ser. No. 13/047,392, filed Mar. 14, 2011 (now U.S. Pat. No. 8,835,831, issued Sep. 16, 2014), Ser. No. 14/450,812, filed Aug. 4, 2014, Ser. No. 13/048,635, filed Mar. 15, 2011 (now U.S. Pat. No. 8,835,905, issued Sep. 16, 2014), Ser. No. 13/106,851, filed May 12, 2011, Ser. No. 13/288,131, filed Nov. 3, 2011, Ser. No. 14/334,848, filed Jul. 18, 2014, Ser. No. 14/032,166, filed Sep. 19, 2013, Ser. No. 13/543,307, filed Jul. 6, 2012, Ser. No. 13/963,847, filed Aug. 9, 2013, Ser. No. 13/693,207, filed Dec. 4, 2012, 61/869,727, filed Aug. 25, 2013, Ser. No. 14/322,503, filed Jul. 2, 2014, and Ser. No. 14/311,954, filed Jun. 23, 2014, Ser. No. 14/459,398, filed Aug. 14, 2014, Ser. No. 14/487,375, filed Sep. 16, 2014, Ser. No. 14/501,983 filed Sep. 30, 2014, Ser. No. 14/503,598, filed Oct. 1, 2014, Ser. No. 14/516,162, filed Oct. 16, 2014, Ser. No. 14/563,781, filed Dec. 8, 2014 are each hereby incorporated by reference in their entirety.

BACKGROUND OF THE INVENTION

Nanostructures often exhibit fascinating physical properties not present in their bulk counterparts. Optical properties of nanostructures have been one of the recent research focuses. Tuning optical properties of nanostructures would facilitate their applications in the semiconductor, optics, and consumer electronics industry. In one example, optical properties of nanostructures can be controlled by their chemical composition. Chemical doping can change electronic structures of the materials semiconductor nanostructures are composed of, which in turn changes their interaction with light. In another example, arranging nanostructures into a regular lattice can yield optical properties individual nanostructures lack. However, these conventional approaches often require complex chemical synthesis or post-synthesis manipulation, and thus are less robust against minute variations of conditions and cannot easily and accurately position nanostructures in a functional device. In contrast, the approach described herein overcomes these problems of the conventional approaches by harnessing small physical sizes of nanostructures and a top-down fabrication process (i.e., part of a piece of bulk material is removed until desired nanostructures are achieved).

BRIEF SUMMARY OF THE INVENTION

Described herein is a nanowire array, comprising a substrate and a plurality of nanowires extending essentially perpendicularly from the substrate; wherein: a refractive index of the nanowires is at least two times of a refractive index of a cladding of the nanowires. Preferably a number density of the nanowires is at most about $1.8/\mu m^2$.

The nanowire array can be fabricated using a method comprising: (a) coating the substrate with a resist layer; (b) generating a pattern of dots in the resist layer using a lithography technique; (c) developing the pattern in the resist layer; (d) depositing a mask layer; (e) lifting off the resist layer; (f) forming the nanowires by dry etching the substrate; (g) optionally removing the mask player; wherein shapes and sizes of the dots determine the cross-sectional shapes and sizes of the nanowires.

The nanowire array can be used as a photodetector, a submicron color filter, a static color display or a dynamic color display.

BRIEF DESCRIPTION OF THE DRAWINGS

FIGS. 2A-2D are SEM images of an exemplary nanowire array.

DETAILED DESCRIPTION OF THE INVENTION

Figure 1A:
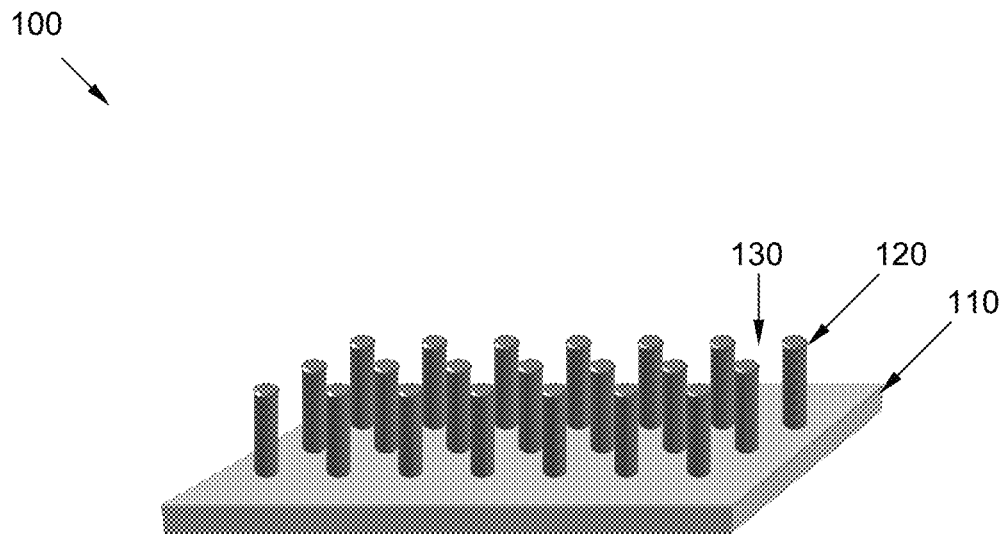
FIG. 1A shows a perspective schematic of a nanowire array.

Described herein is a nanowire array, according to an embodiment, comprising a substrate and a plurality of nanowires extending essentially perpendicularly from the substrate; wherein a refractive index of the nanowires is at least two times of a refractive index of a cladding of the nanowires. A number density of the nanowires preferably is at most about $1.8/\mu m^2$.

According to an embodiment, a nanowire array comprises a substrate and a plurality of nanowires extending essentially perpendicularly from the substrate; wherein the nanowire array is operable as a submicron color filter. A "submicron color filter" as used herein means that an optical filter that allows light of certain wavelengths to pass through and optical elements in the filter are less than a micron at least in one dimension.

According an embodiment, a nanowire array comprises a substrate and a plurality of nanowires extending essentially perpendicularly from the substrate; wherein the nanowires do not substantially couple. The term "substantially couple" as used herein means the nanowires collectively interact with incident light such that spectral properties (e.g., reflectance spectrum) of the nanowire array are distinct from spectral properties of individual nanowire in the nanowire array. The term "the nanowires do not substantially couple" as used herein means one nanowire does not affect the properties of a neighboring nanowire. For example, when the pitch of the nanowires is changed and there is no color change of the light absorbed or reflected by the nanowire, then the nanowires do not substantially couple.

According an embodiment, a nanowire array comprises a substrate and a plurality of nanowires extending essentially perpendicularly from the substrate; the nanowire array does not appear black to naked eye. The term "naked eye" as used herein means human visual perception that is unaided by enhancing equipment. The term "the nanowire array does not appear black to naked eye" as used herein means that the reflected visible light from the nanowire is substantially zero, which could happen under certain conditions based on the nanowire length, radius and pitch, as well as the optical properties of the substrate.

According to an embodiment, a nanowire as used herein means a structure that has a size constrained to at most 1000 nm in two dimensions and unconstrained in the other dimension. An array as used herein means a systematic arrangement of objects such as a grid. The term "nanowires extending essentially perpendicularly from the substrate" as used herein means that angles between the nanowires and the substrate are from 85° to 90°. Cladding as used herein means a substance surrounding the nanowires, which can be vacuum, air, water, etc. A refractive index of the nanowires as used herein means a ratio of the speed of light in vacuum relative to that in the nanowires. A number density of the nanowires as used herein means that an average number of nanowires per unit area of the substrate.

According to an embodiment, each of the nanowires in the nanowire array has an essentially uniform chemical composition from one end of the nanowire to an opposite end of the nanowire in a longitudinal direction of the nanowire.

According to an embodiment, chemical composition of the nanowires as used herein means the simplest whole number ratio of atoms of each element present in the nanowires. The term "essentially uniform chemical composition" as used herein means that the ratio of atoms varies at most 3%, preferably at most 1%. A longitudinal direction of the nanowire as used herein means a direction pointing from one end of the nanowire farthest from the substrate to one end of the nanowire nearest to the substrate.

According to an embodiment, each of the nanowires in the nanowire array is single crystalline, multi-crystalline or amorphous. That the nanowire is single crystalline as used herein means that the crystal lattice of the entire nanowire is continuous and unbroken throughout the entire nanowire, with no grain boundaries therein. That the nanowire is multi-crystalline as used herein means that the nanowire comprises grains of crystals separated by grain boundaries. That the nanowire is amorphous as used herein means that the nanowire has a disordered atomic structure.

According to an embodiment, the nanowires in the nanowire array are composed of a semiconductor or an electrically insulating material. A conductor can be a material with essentially zero band gap. The electrical conductivity of a conductor is generally above $10^3$ S/cm. A semiconductor can be a material with a finite band gap up to about 3 eV and general has an electrical conductivity in the range of $10^3$ to $10^{-8}$ S/cm. An electrically insulating material can be a material with a band gap greater than about 3 eV and generally has an electrical conductivity below $10^{-8}$ S/cm.

According to an embodiment, the nanowires in the nanowire array, comprise one or more materials selected from the group consisting of Si, Ge, GaN, GaAs, $SiO_2$, and $Si_3N_4$.

According to an embodiment, radii of the nanowires in the nanowire array are from 10 to 1000 nm; lengths of the nanowires are from 0.01 to 10 μm.

According to an embodiment, the nanowires and the substrate in the nanowire array have substantially the same chemical composition. The term "same chemical composition" as used herein means that the substrate and the nanowires are identical materials. The term "substantially same" here means the chemical composition differs by no more than 3%, preferably by no more than 1%.

According to an embodiment, the nanowires and the substrate in the nanowire array are single crystalline and the lattices of the nanowires and the lattice of the substrate are continuous at interfaces therebetween. Namely, there is no grain boundary at the interfaces between the nanowires and the substrate.

According to an embodiment, the nanowires in the nanowire array are arranged in a predetermined pattern such as a rectangular grid, a square grid, concentric circle, hexagonal grid.

According to an embodiment, a distance of a nanowire to a nearest neighbor of the nanowire along a direction parallel to the substrate (also known as "pitch" or "pitch distance") is at least 800 nm, preferably at most 10000 nm.

According to an embodiment, a reflectance spectrum of the nanowire array has a dip; the dip position shifts to shorter wavelength with decreasing radii of the nanowires; and the dip position is independent from a distance of a nanowire to a nearest neighbor of the nanowire along a direction parallel to the substrate. A reflectance spectrum as used herein means a ratio of the intensity of reflected light at a certain wavelength to the intensity of incident light at the same wavelength, as a function of wavelength. A "dip" in a reflectance spectrum as used herein means that a region in the reflectance spectrum wherein the reflectance is smaller than the reflectance in surrounding regions of the reflectance spectrum. The "dip position" as used herein means the wavelength in the dip at which the reflectance is a minimum.

According to an embodiment, a reflectance spectrum of the nanowire array is independent from incident angles of illumination.

According to an embodiment, an incident angle as used herein means the angle between a ray of light incident on the substrate and the line perpendicular to the substrate at the point of incidence.

According to an embodiment, a method of fabricating the nanowire array comprises: (a) coating the substrate with a resist layer; (b) generating a pattern of dots in the resist layer using a lithography technique; (c) developing the pattern in the resist layer; (d) depositing a mask layer; (e) lifting off the resist layer; (f) forming the nanowires by dry etching the substrate; (g) optionally removing the mask player; wherein shapes and sizes of the dots determine the cross-sectional shapes and sizes of the nanowires.

According to an embodiment, a resist layer as used herein means a thin layer used to transfer a pattern to the substrate which the resist layer is deposited upon. A resist layer can be patterned via lithography to form a (sub)micrometer-scale, temporary mask that protects selected areas of the underlying substrate during subsequent processing steps. The resist is generally proprietary mixtures of a polymer or its precursor and other small molecules (e.g. photoacid generators) that have been specially formulated for a given lithography technology. Resists used during photolithography are called photoresists. Resists used during e-beam lithography are called e-beam resists. "Dots" as used herein means discrete regions. A lithography technique can be photolithography, e-beam lithography, holographic lithography. Photolithography is a process used in microfabrication to selectively remove parts of a thin film or the bulk of a substrate. It uses light to transfer a geometric pattern from a photo mask to a light-sensitive chemical photo resist, or simply "resist," on the substrate. A series of chemical treatments then engraves the exposure pattern into the material underneath the photo resist. In complex integrated circuits, for example a modern CMOS, a wafer will go through the photolithographic cycle up to 50 times. E-beam lithography is the practice of scanning a beam of electrons in a patterned fashion across a surface covered with a film (called the resist), ("exposing" the resist) and of selectively removing either exposed or non-exposed regions of the resist ("developing"). The purpose, as with photolithography, is to create very small structures in the resist that can subsequently be transferred to the substrate material, often by etching. It was developed for manufacturing integrated circuits, and is also used for creating nanotechnology artifacts. Holographic lithography (also known as Interference lithography) is a technique for patterning regular arrays of fine features, without the use of complex optical systems or photomasks. The basic principle is the same as in interferometry or holography. An interference pattern between two or more coherent light waves is set up and recorded in a recording layer (photoresist). This interference pattern consists of a periodic series of fringes representing intensity minima and maxima. Upon post-exposure photolithographic processing, a photoresist pattern corresponding to the periodic intensity pattern emerges. A mask layer as used herein means a layer that protects an underlying portion of the substrate from being etched. "Dry etching" as used herein means an etching technique without using a liquid etchant.

According to an embodiment, a method using the nanowire array 1 as a photodetector comprises: shining light on the nanowire array; measuring photocurrent on the nanowires; measuring photocurrent on the substrate; comparing the photocurrent on the nanowires to the photocurrent on the substrate. A photodetector as used herein means a sensor of light.

According to an embodiment, a method using the nanowire array as a static color display comprises: determining locations and radii of the nanowires from an image to be displayed; fabricating the nanowires with the determined radii at the determined locations on the substrate; shining white light on the nanowire array.

According to an embodiment, a dynamic color display comprises the nanowire array, an array of independently addressable white light sources on a side of the substrate opposite the nanowires, wherein each white light source corresponds to and is aligned in the substrate plane with one of the nanowires. "Independently addressable white light sources" as used herein mean that each source can be controlled, adjusted, turned on or off, independently from other sources. "White light" as used herein means a combination of visible light of different wavelengths in equal proportions.

According to an embodiment, the white light sources in the dynamic color display are white LEDs. LEDs are also known as light-emitting diodes. There are two primary ways of producing whitelight using LEDs. One is to use individual LEDs that emit three primary colors—red, green, and blue—and then mix all the colors to form white light. The other is to use a phosphor material to convert monochromatic light from a blue or UV LED to broad-spectrum white light, much in the same way a fluorescent light bulb works.

According to an embodiment, in the dynamic color display, a first group of the nanowires have a first radius, a second group of the nanowires have a second radius, and a third group of the nanowires have a third radius, wherein the first group of the nanowires only allow red light to pass, the second group of the nanowires only allow green light to pass, and the third group of the nanowires only allow blue light to pass.

According to an embodiment, a submicron color filter comprising the nanowire array, wherein each nanowire is placed on a photodetector, wherein only incident light with wavelengths in a dip of a reflectance spectrum of each nanowire is allowed reach the photodetector below. A method using the submicron color filter comprises shining white light on the nanowire array, detecting transmitted light below the nanowires.

According to an embodiment, a ratio of a radius of the nanowires to a pitch of the nanowires is at most 0.5.

EXAMPLES

Figure 1B:
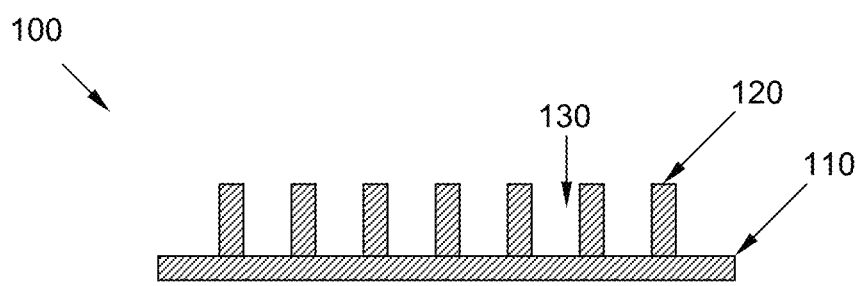
FIG. 1B shows a cross sectional schematic of the nanowire array of FIG. 1A.

FIGS. 1A and 1B show schematics of a nanowire array 100, according to an embodiment. The nanowire array 100 comprises a substrate 110 and a plurality of nanowires 120 extending essentially vertically from the substrate 110 (e.g. angles between the nanowires 120 and the substrate 110 are from 85° to 90°). Each nanowire 120 preferably has uniform chemical composition along its entire length. Each nanowire 120 is single crystalline, multi-crystalline or amorphous. The nanowires 120 preferably are made of a suitable semiconductor or an electrically insulating materials, examples of which include Si, Ge, GaN, GaAs, SiO2, $Si_3N_4$, etc. A ratio of the refractive index (i.e., refractive index contrast) of the nanowires 120 and the refractive index of a cladding 130 (i.e., materials surround the nanowires 120) is preferably at least 2, more preferably at least 3. Radii of the nanowires 120 preferably are from 10 to 1000 nm, more preferably from 20 to 80 nm, most preferably from 45 to 75 nm. Lengths of the nanowires 120 are preferably from 0.01 to 10 μm, more preferably 0.1 to 5 μm. The nanowires 120 and the substrate 110 preferably have substantially the same chemical composition. Crystal lattices of the nanowires 120 and the substrate 110, if both are single crystalline, are preferably continuous at interfaces therebetween. The nanowires 120 can have the same or different shape and size. The nanowires 120 can be arranged in any suitable pattern, examples of which include a rectangular grid, a square grid, a hexagonal grid, concentric rings, etc. A distance between a nanowire 120 of the nanowire array 100 to a nearest neighbor nanowire of the nanowire array 100 along a direction parallel to the substrate is also known as "pitch" or "pitch distance". A ratio of the radius of the nanowires 120 to the pitch should not be too high, i.e., preferably at most 0.5, more preferably at most 0.1. If this ratio is too high, the nanowires 120 substantially couple to each other (i.e., the nanowires 120 collectively interact with incident light such that spectral properties (e.g., reflectance spectrum) of the nanowire array 100 are distinct from spectral properties of individual nanowire 120 in the nanowire array 100) and the nanowire array 100 appears black to naked eyes and cannot function as color filters or displays. Preferably, the number density of the nanowires 120 (average number of nanowires 120 per unit area on the substrate 110) is thus at most about 1.8/μm². Preferably, the pitch of the nanowires 120 is at least 500 nm.

FIGS. 2A-2D show exemplary scanning electron microscope (SEM) images of the nanowire array 100. In these exemplary SEM images, 10,000 nanowires 120 consisting of silicon are arranged in a 100 μm×100 μm square grid on the substrate 110 consisting of silicon, wherein a distance of one nanowire to a nearest neighbor nanowire of the nanowire array 100 along a direction parallel to the substrate is about 1 μm. The length of the nanowires 120 are about 1 μm. The radius of the nanowires 120 is about 45 nm.

Figure 3A:
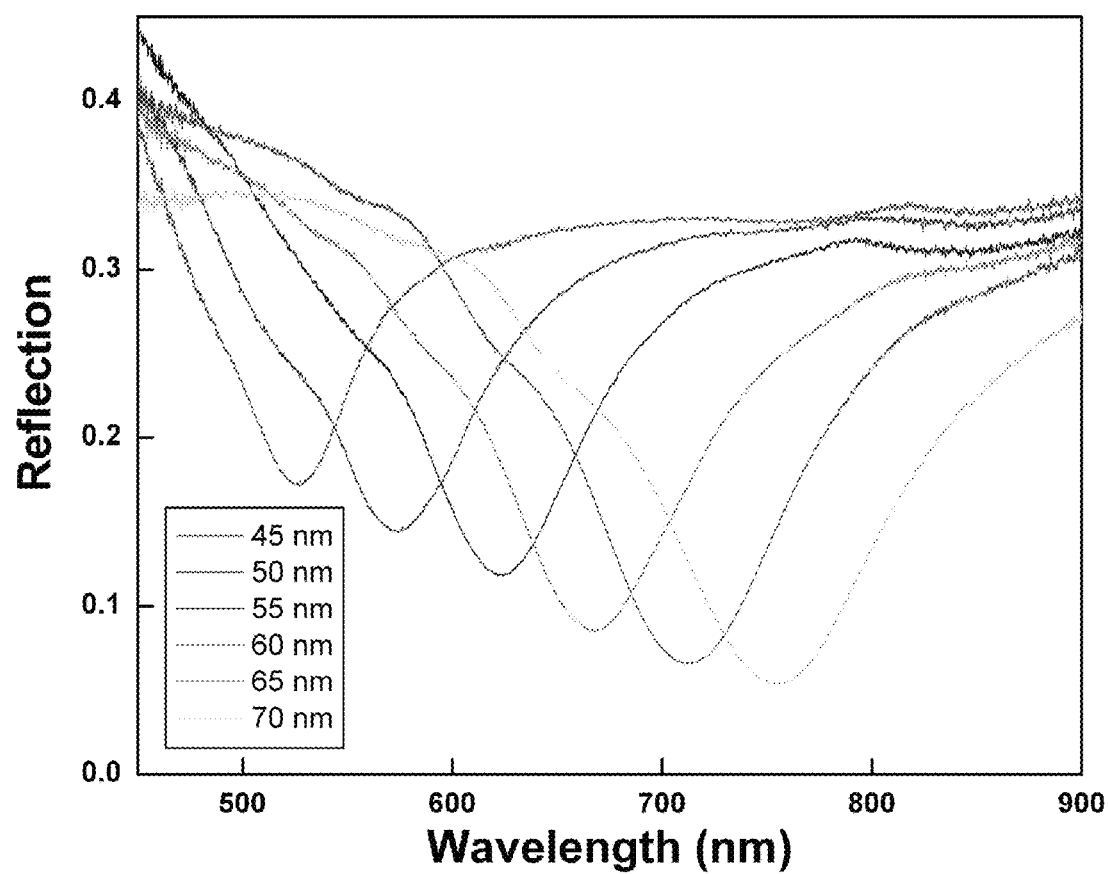
FIG. 3A shows measured reflectance spectra of nanowire arrays with nanowires of a series of different radii.

FIG. 3A shows measured reflectance spectra of five nanowire arrays 100, each of which consists 10,000 nanowires 120 consisting of silicon arranged in a 100 μm×100 μm square grid on the substrate 110 consisting of silicon, wherein the pitch of these nanowire arrays 100 and the length of the nanowires 120 are about 1 μm. These five nanowire arrays 100 are identical except that the nanowires 120 thereof have uniform radii of 45 nm, 50 nm, 55 nm, 60 nm, 65 nm and 70 nm, respectively. Under white light illumination, these nanowire arrays 100 appear to be different colors (e.g., red, green, blue, cyan, etc.) to naked eyes. The reflectance spectrum of each of these nanowire arrays 100 shows one dip, i.e., incident light at wavelengths within the dip is reflected at a lesser proportion compared to incident light at wavelengths outside the dip. Positions of the dip dictates the apparent colors of the nanowire arrays 100. For example, if the position of the dip is between 700 and 635 nm, the nanowire array 100 appears cyan; if the position of the dip is between 560 and 490 nm, the nanowire array 100 appears magenta; if the position of the dip is between 490 and 450 nm, the nanowire 100 appears yellow. Position of the dip progressively shifts to shorter wavelength from about 770 nm in the nanowire array 100 with the largest nanowires 120 (70 nm in radius) to about 550 nm in the nanowire array 100 with the smallest nanowires 120 (45 nm in radius). The positions of the dips in these five nanowire arrays 100 range across the entire visible spectrum. The position of the dip is independent from the pitch of the nanowire array 100, which indicates that the dips are not due to diffractive or coupling effects. Although diffractive and coupling effects are not required, the nanowire array 100 can function when such effects are present. The nanowire array 100 preferably has a pitch greater than 800 nm so that diffractive and coupling effects do not dominate. The magnitude of the dips decreases with increasing pitches because greater pitch leads to lower number density of the nanowires 120. FIG. 3A also illustrates that magnitudes of the dips increase with the positions of the dips in wavelength, due to strong material dispersion of the substrate material above its bandgap (i.e., the refractive index of the substrate 110 increases at wavelengths above the bandgap of the material thereof while the effective refractive index of a guided mode in the nanowires 120 remains close to the refractive index of air, which leads to higher refractive index contrast between the guided mode and the substrate 110 and thus stronger reflectance in the dip, i.e., smaller magnitude of the dip, at shorter wavelengths). For a nanowire array with thicker nanowires, more than one dip may be present in its reflectance spectrum and the nanowire array may appear in a combination of colors.

Figure 7A:
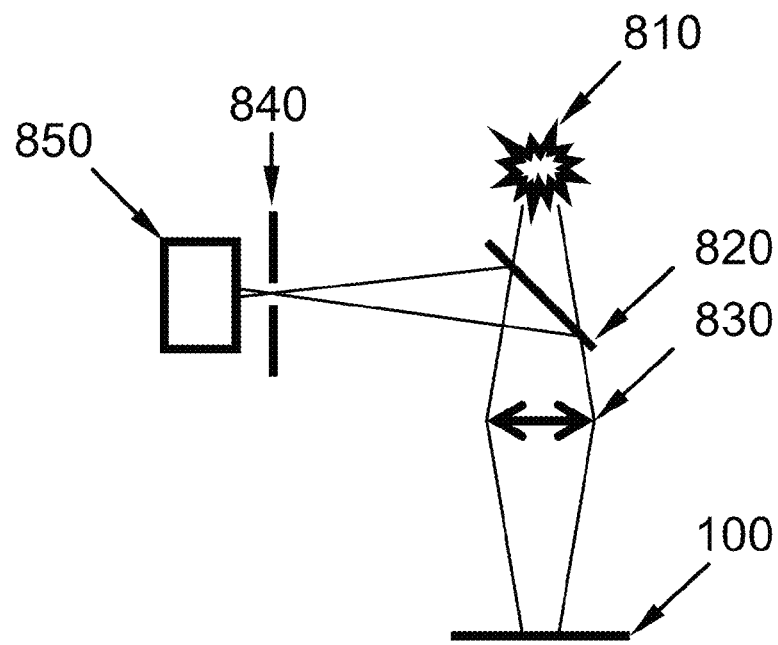
FIGS. 7A and 7B show schematics of two exemplary apparatuses for measuring reflectance spectra of the nanowire array.
Figure 7B:
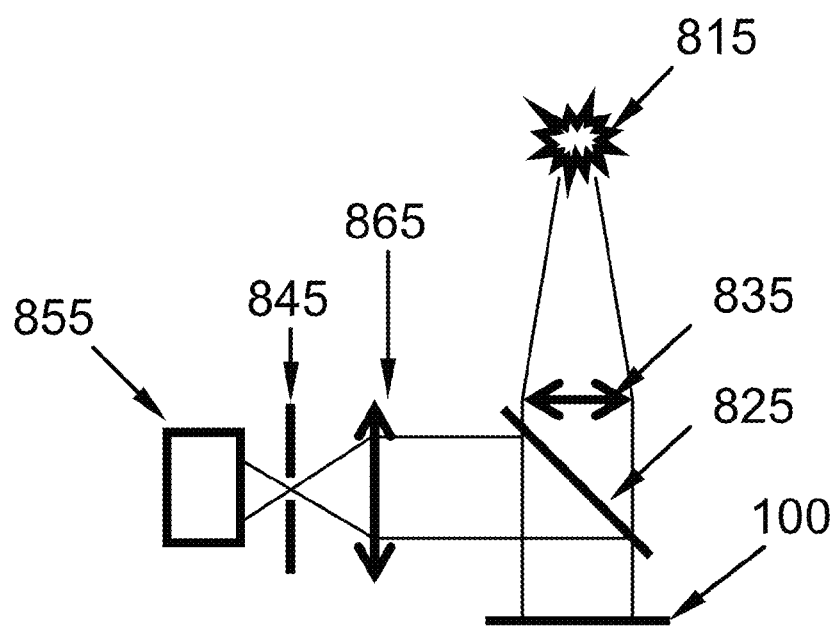

The reflectance spectra can be measured with focused or collimated incident illumination. In an exemplary measurement as shown in FIG. 7A, incident white light from a light source 810 is focused by 20× objective lens 830 (numerical aperture=0.5); reflected light is collected by the same objective lens 830 and partially reflected by a beam splitter 820 to a spectrometer 850. An iris 840 is used at the image plane of the objective lens 830 to reject any light other than light reflected by the nanowire array 100. In another exemplary measurement as shown in FIG. 7B, incident white light from a light source 815 is collimated by a lens 835 and directed to the nanowire array 100 through a beam splitter 825; reflected light is collected by a 10× objective lens 865 to a spectrometer 855. An iris 845 is used at the image plane of the objective lens 865 to reject any light other than light reflected by the nanowire array 100. A silver mirror can used to measure absolute intensity of reflected light, which is used to calculate (i.e., normalize) the reflectance spectra. The reflectance spectra are found to be essentially independent from the incident angle, which indicates that the reflectance spectra are dominated by coupling dynamics between normal component of the incident light and the nanowire array 100.

Figure 3B:
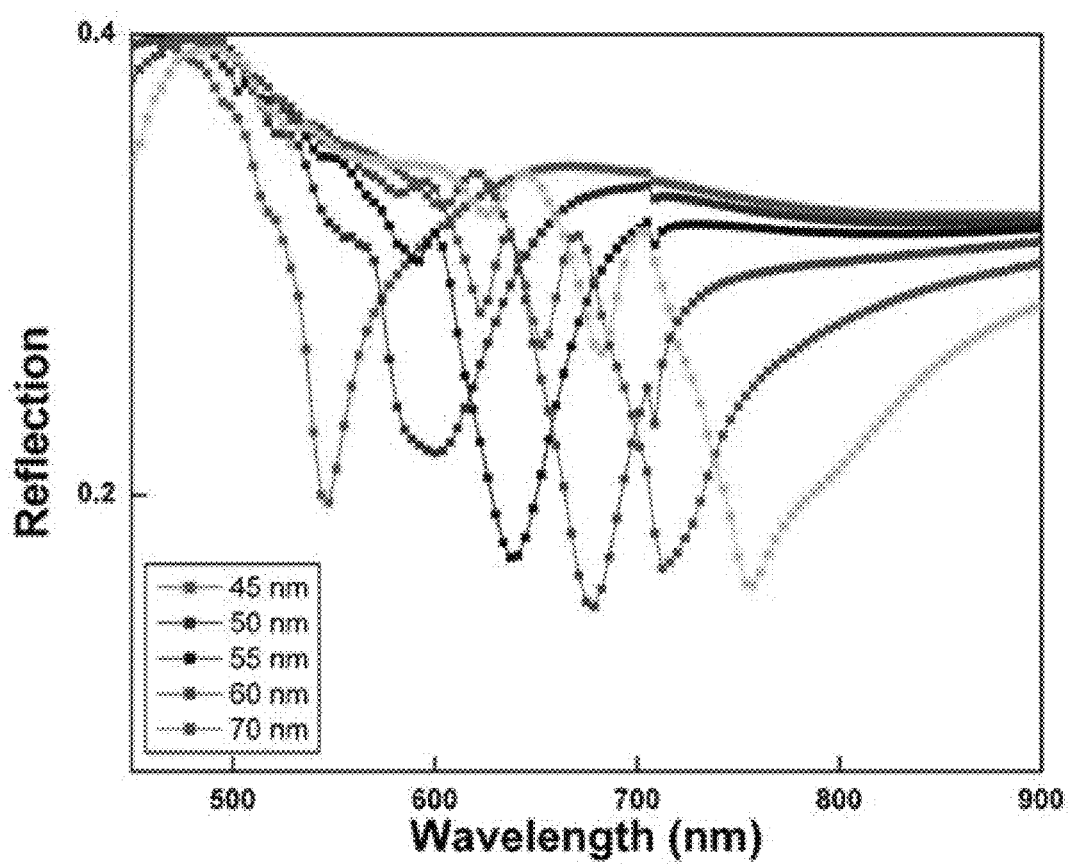
FIG. 3B shows simulated reflectance spectra of the nanowire arrays of FIG. 3A.

FIG. 3B shows simulated reflectance spectra of the five nanowire arrays 100 in FIG. 3A using the finite difference time domain (FDTD) method. The FDTD method is a method of numerically simulating propagation of light in a structure and can be used to predict detailed characteristics of the propagation. The simulated reflectance spectra are quantitatively in good agreement with the measured reflectance spectra of FIG. 3A, with respect to the dip position as a function of nanowire radius. Compared to the measured reflectance spectra, simulated spectra have shallower dips, which could be due to a reflectivity difference between roughened substrate surface in actual nanowire arrays and ideally flat substrate surface presumed in the simulation. Lumerical's (Lumerical Solutions, Inc.) FDTD and MODE solvers were used to perform the simulation. Two dimensional models were constructed in MODE solver by simply specifying nanowire radius, pitch and material properties. A periodic boundary condition is then imposed in the substrate plane. These modes were used to study the evolution of the fundamental mode of the nanowires 120 as a function of wavelength. Full three dimensional models were constructed in Lumerical's FDTD solver by specifying complete nanowire geometry along with pitch and material properties. Periodic boundary conditions in the substrate plane and absorbing boundary conditions along the z axis (normal direction of the substrate 110) were imposed. A plane wave pulse source of the appropriate bandwidth was launched along the z axis and monitors placed to compute the total absorbed, transmitted and reflected fluxes as a function of wavelength. The nanowires 120 and the substrate 110 were assumed to be silicon in the simulation.

Figure 3C:
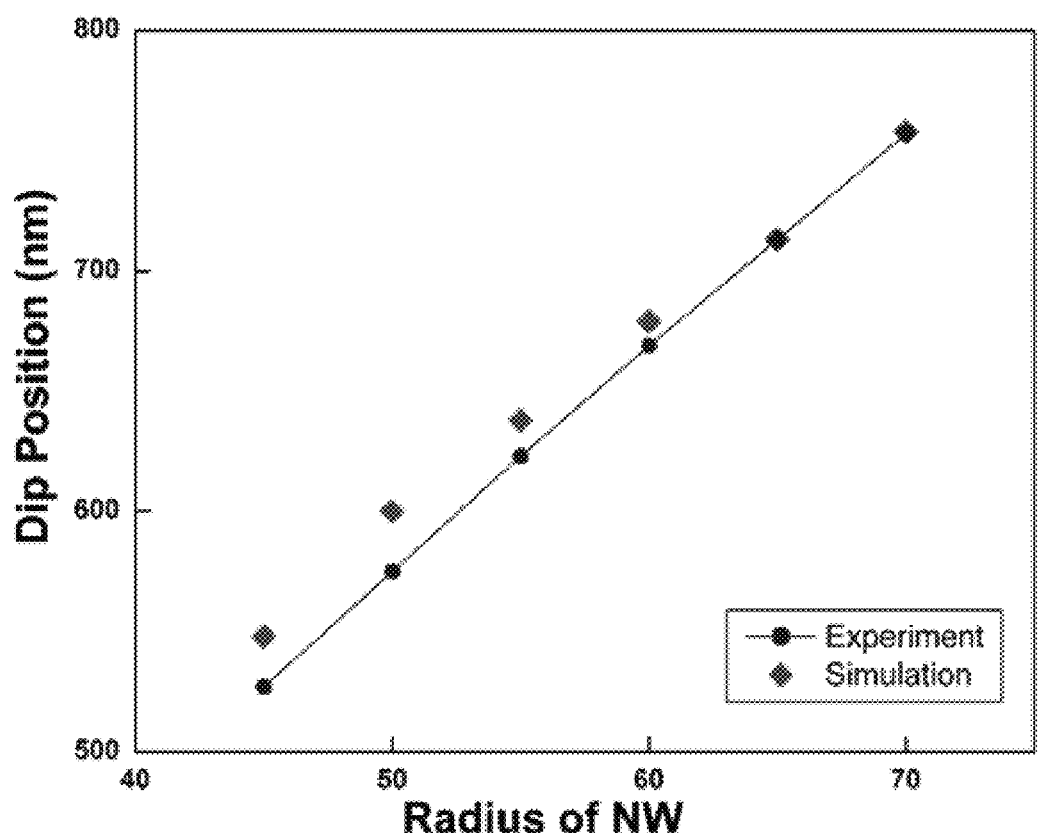
FIG. 3C shows dip positions in measured and simulated reflectance spectra of nanowire arrays, as functions of the radii of the nanowires thereon.

FIG. 3C shows the positions of the dips as a function of radii of the nanowires 120 in both of the measured and simulated reflectance spectra, which shows an essentially linear dependence on the nanowire radii. The essentially linear dependence indicates a strong correlation or agreement between the measured and simulated reflectance spectra.

Figure 4A:
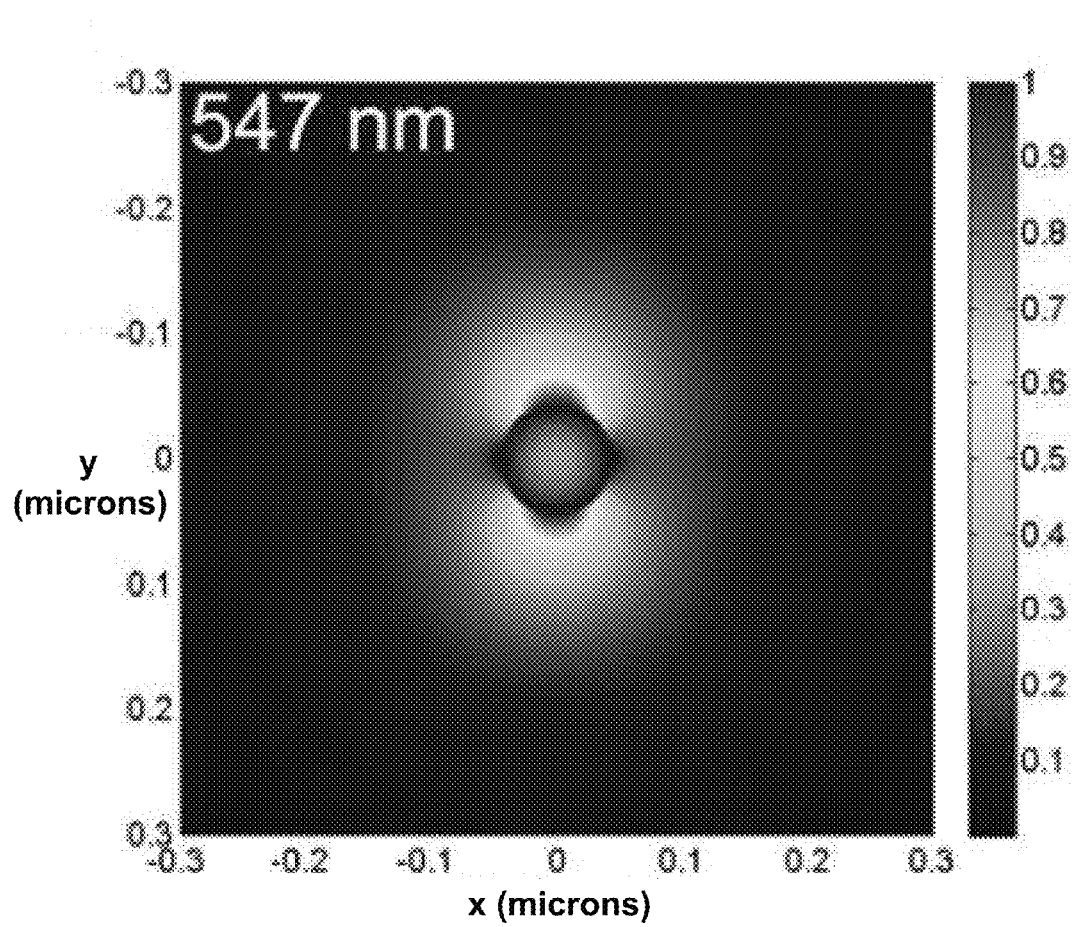
FIG. 4A-4C show a major transverse component of the $H_{1,1}$ mode at different wavelengths, near a nanowire in an nanowire array.
Figure 4B:
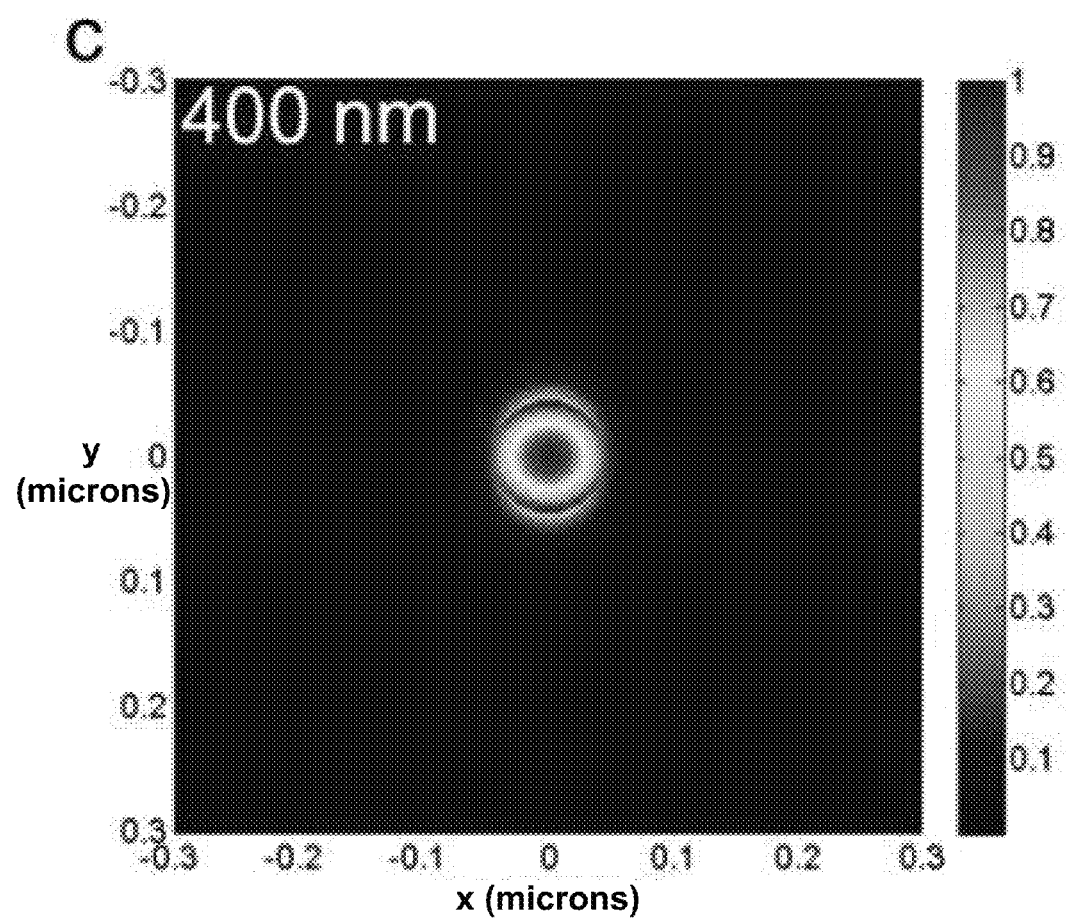
Figure 4C:
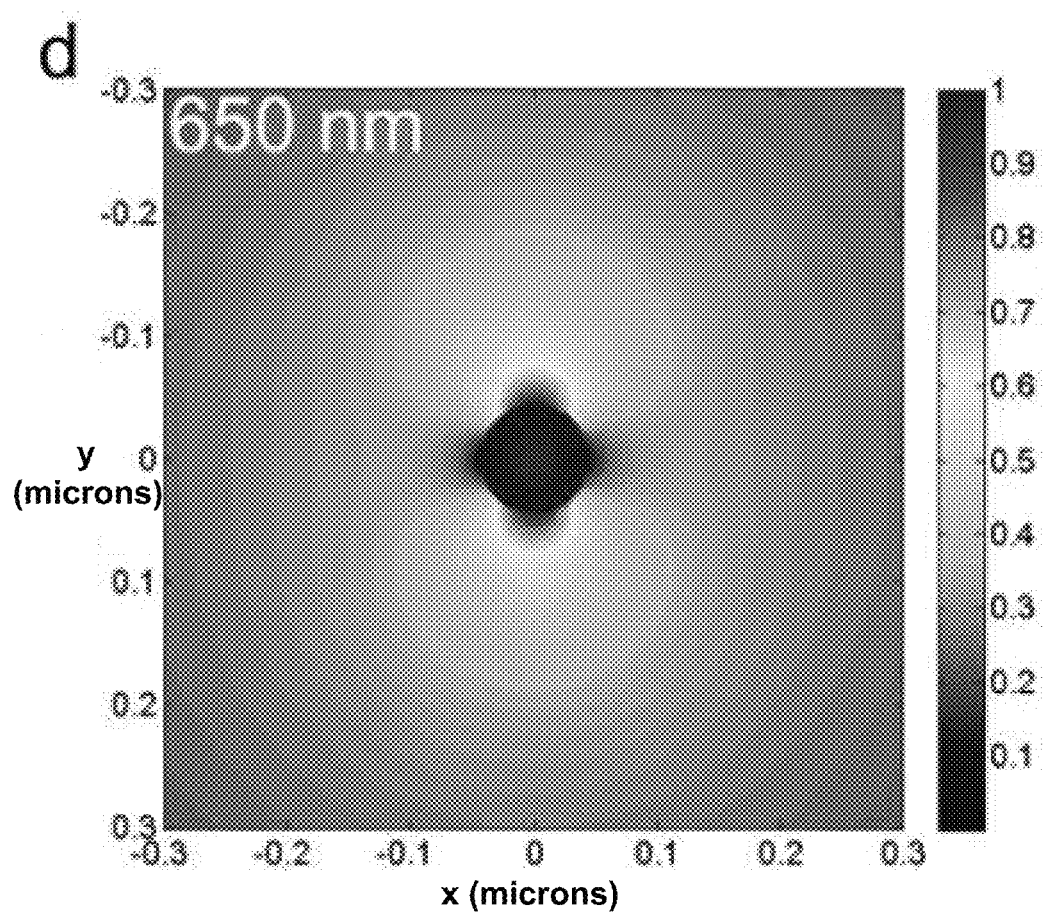
Figure 4D:
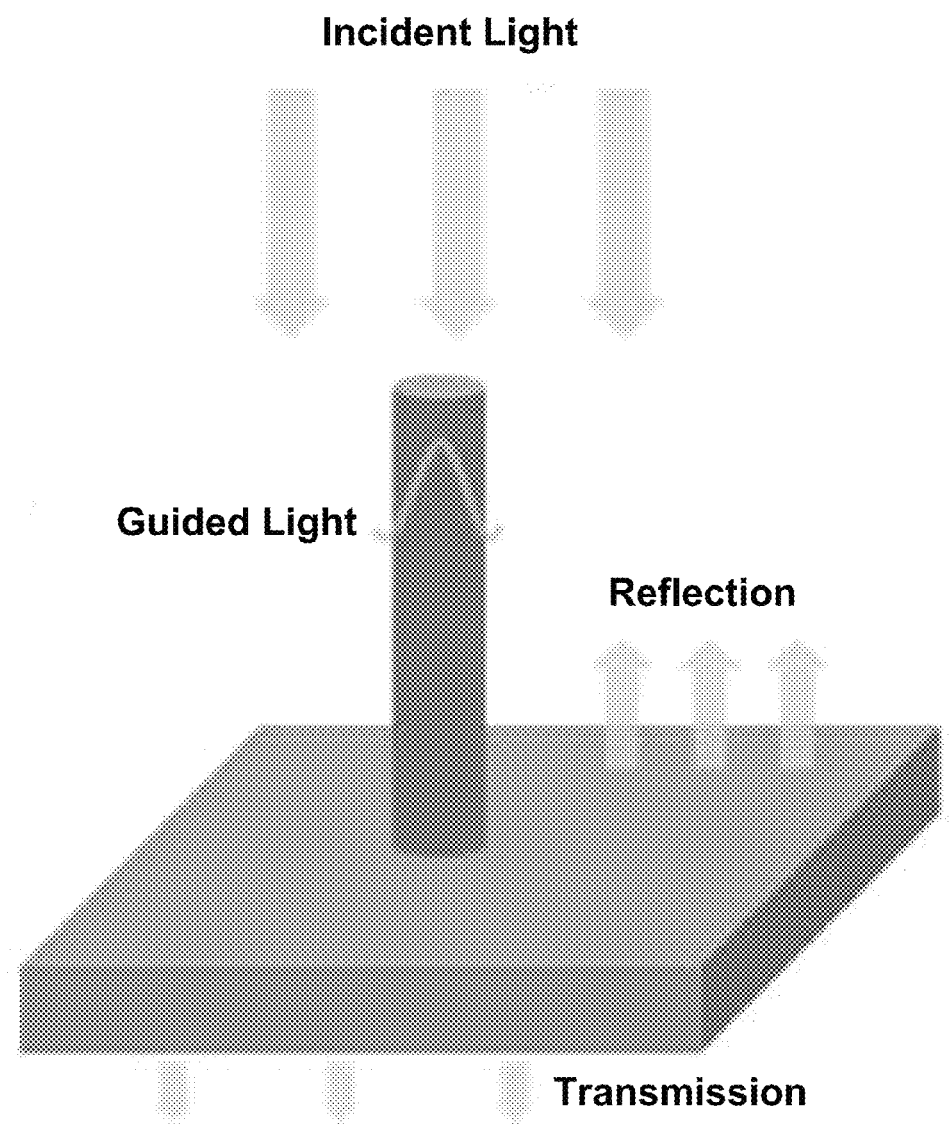
FIG. 4D shows a schematic illustration of possible pathways of white light normally incident on the nanowire array.

Wavelength selective reflection of the nanowire array 100 as shown in FIGS. 3A and 3B originates from strong wavelength dependence of field distribution of the fundamental guided mode ($HE_{1,1}$ mode) of each nanowire 120. The fundamental guided mode as used herein means the guided mode with the lowest frequency. The guided mode of a nanowire 120 as used herein means a mode whose field decays monotonically in the transverse direction (directions parallel to the substrate 110) everywhere external to the nanowire 120 and which does not lose power to radiation. Symmetry prevents efficient interaction between the nanowire 120 and other guided mode, and the nanowire 120 is too small to support higher order $HE_{1,m}$ modes (guided modes with higher frequency). FIGS. 4A-4C show a major transverse component (e.g. $E_y$) (a field component perpendicular to the direction of propagation of the mode) of the $H_{1,1}$ mode at different wavelengths. At wavelengths in the dip of the reflectance spectrum, the field distribution of the $HE_{1,1}$ mode of each nanowire 120 is characterized by a transverse field that is partially contained in the nanowire 120 and partially extends into the cladding 130, as shown in FIG. 4A. Incident light at these wavelengths can efficiently excite the $HE_{1,1}$ mode and be guided by the nanowire 120 to the substrate 110 or be absorbed by the nanowire 120. The large refractive index contrast between the nanowire 120 and the cladding leads to non-negligible longitudinal field component ($E_z$) (i.e., field component parallel to the direction of propagation of the mode) which has significant overlap with the nanowire 120; since the modal absorption is proportional to the spatial density of electromagnetic energy, which includes $E_z$, incident light at these wavelengths can both efficiently couple to (i.e., a significant portion of the incident light propagates inside the nanowire 120) and be absorbed by the nanowire 120. At wavelengths well below the dip of the reflectance spectrum, the field distribution of the $HE_{1,1}$ mode of each nanowire 120 is characterized by a transverse field essentially confined in the nanowire 120 due to large refractive index contrast between the nanowire 120 and the cladding, as shown in FIG. 4B. Incident light at these wavelengths cannot efficiently excite the $HE_{1,1}$ mode and thus cannot be efficiently guided or absorbed by the nanowire 120; incident light at these wavelengths is substantially reflected by an interface of the substrate 110 and the cladding 130. At wavelengths well above the dip of the reflectance spectrum, the field distribution of the $HE_{1,1}$ mode of each nanowire 120 is characterized by a transverse field essentially expelled from the nanowire 120, as shown in FIG. 4C. Incident light at these wavelengths can efficiently excite the $HE_{1,1}$ mode but the $HE_{1,1}$ mode at these wavelengths cannot be efficiently guided or absorbed by the nanowire 120; incident light at these wavelengths is substantially reflected by an interface of the substrate 110 and the cladding. FIG. 4D shows schematic illustration of possible pathways of white light normally incident on the nanowire array 100. Light of wavelengths beyond the dip in the reflectance spectrum is reflected by the substrate 110; light of wavelengths in the dip is guided by the nanowire 120 to transmitted through the substrate 110 or absorbed by the nanowire 120.

Figure 5A:
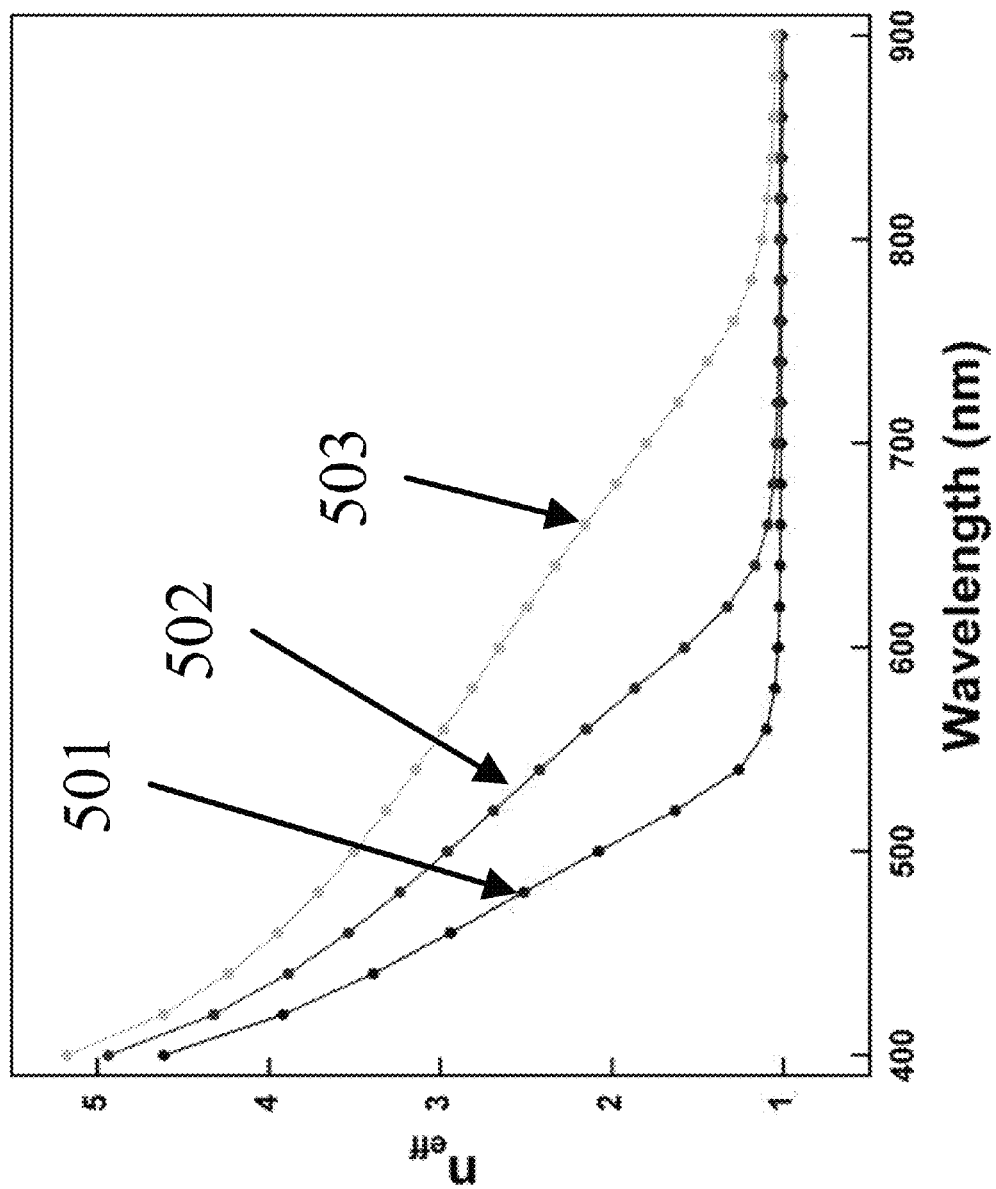
FIG. 5A shows simulated effective refractive indexes ($n_{eff}$) of the $H_{1,1}$ modes, as a function of wavelength, of three nanowire arrays with different nanowire radii.

The position of the dip of the reflectance spectrum is determined by the radius of the nanowire 120. FIG. 5A shows simulated effective refractive indexes ($n_{eff}$) of the $H_{1,1}$ modes, as a function of wavelength, of three nanowire arrays 100 with different nanowire radii (45 nm, 55 nm and 70 nm in traces 501, 502 and 503, respectively), wherein $n_{eff}$ are obtained by the FDTD method over a 1 μm by 1 μm unit cell under periodic boundary conditions, the material of the nanowire arrays 100 is assumed to be silicon, the cladding is assumed to be air, and length of the nanowires 120 is assumed to be 1 μm. When light propagates in a medium that comprises materials of different indices of refraction, the light behaves as if it propagates in a uniform medium with a uniform index of refraction whose value is some intermediate of those of the materials. This uniform index is referred to as the effective refractive index. A periodic boundary condition is a set of boundary conditions that are often used to model a large system as an infinite periodic tile of a small unit cell.

In each trace, $n_{eff}$ increases sharply and approaches $n_{Si}$ (refractive index of silicon) for wavelengths shorter than the corresponding dip position in FIG. 3A. The dip occurs where $n_{eff}$ asymptotes to $n_{air}$ (refractive index of air). $n_{eff}$ as a function of wavelength (also called a dispersion curve) shifts to longer wavelength with increasing nanowire radius.

Figure 5B:
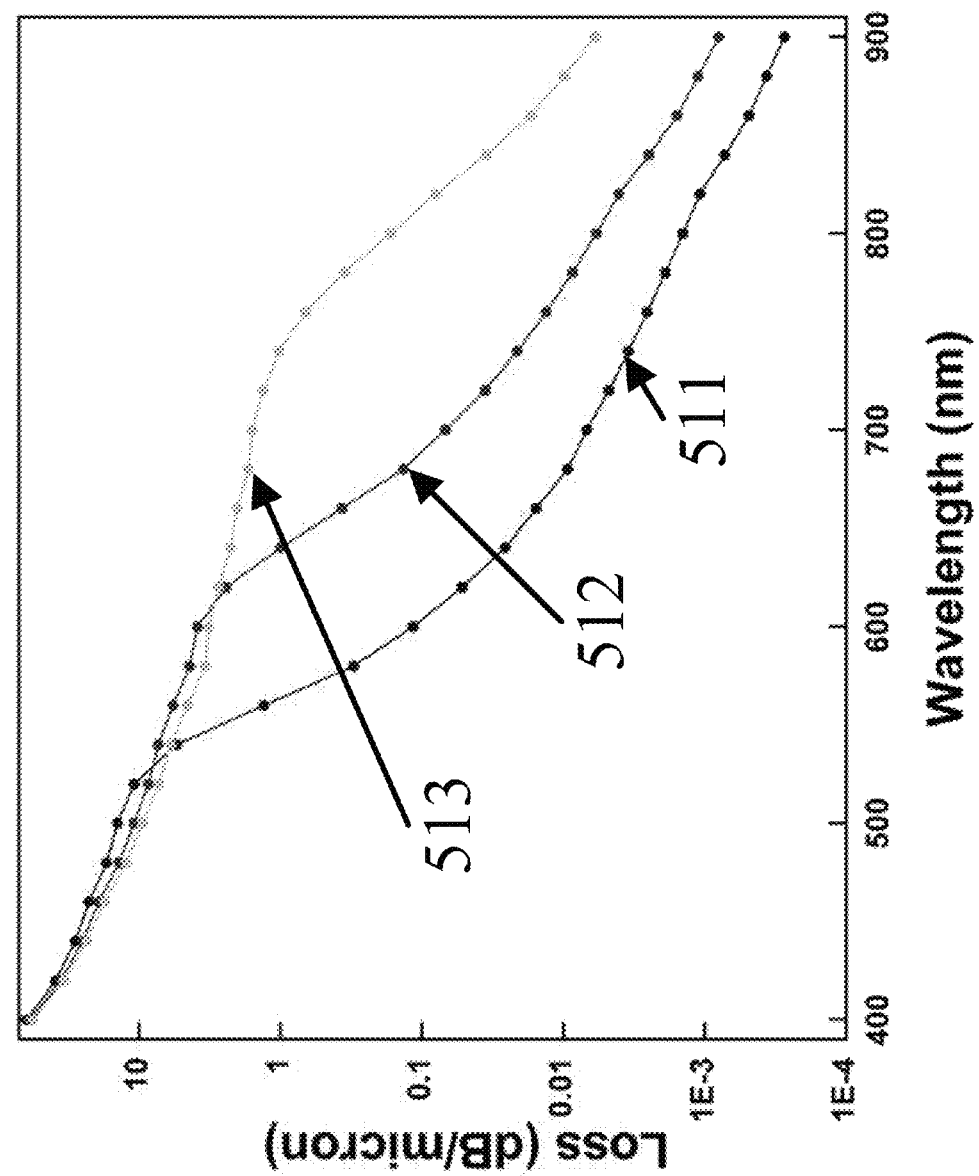
FIG. 5B shows simulated absorption spectra of the nanowire arrays of FIG. 5A.
Figure 5C:
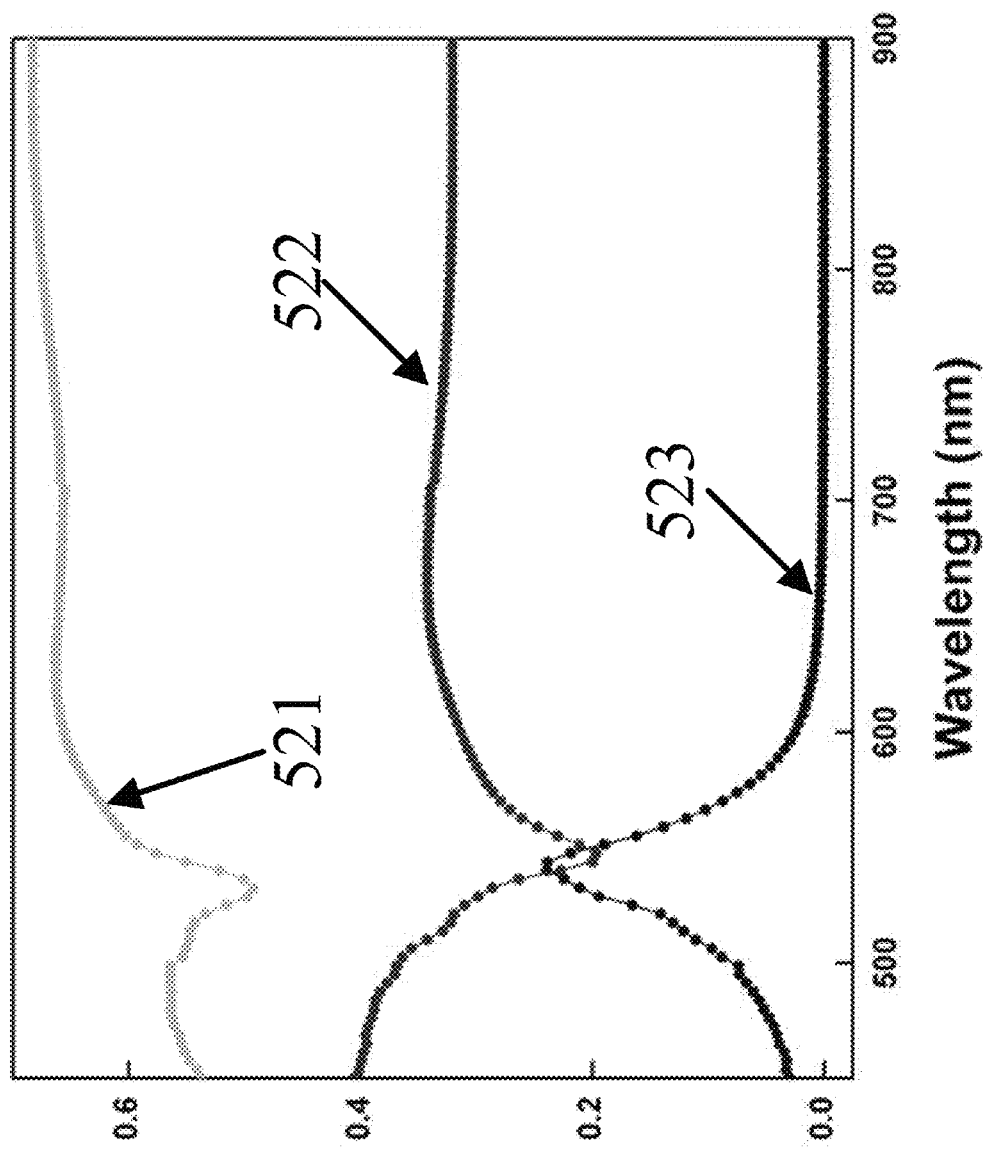
FIG. 5C compares a simulated absorption spectrum of the substrate in a nanowire array, a simulated absorption spectrum of the nanowires (of 45 nm radius) in the nanowire array, and a simulated reflectance spectrum of the entire nanowire array.

FIG. 5B shows simulated absorption spectra (obtained by the FDTD method) of the nanowire arrays 100 of FIG. 5A (traces 511, 512 and 513 corresponding to nanowire arrays with nanowires of 45 nm, 55 nm and 70 nm radii, respectively). For blue light (<500 nm) over 90% of the $H_{1,1}$ mode can be absorbed in a 1 μm length of the nanowire. FIG. 5C compares a simulated absorption spectrum 521 of the substrate 110 in the nanowire array 100 with nanowires 120 of 45 nm radius (corresponding to traces 501 and 511), a simulated absorption spectrum 523 of the nanowires 120 of 45 nm radius in this nanowire array 100, and a simulated reflectance spectrum 522 of this nanowire array 100. The dip in the reflectance spectrum 522 is slightly redshifted relative to the peak in the absorption spectrum 523 of the nanowires 120, which indicates that the long wavelength edge of the dip arises more from coupling to the substrate 110. Nonetheless, this shows that the guided light is in fact absorbed in the nanowires 120, and so the shape of the reflectance spectrum 523 and the amount of light absorbed in the nanowires 120 can be controlled by altering the length thereof. The light absorbed by the substrate 110 (see trace 521) can be enhanced or diminished by the nanowires 120 relative to light absorption of a planar substrate, depending on whether the nanowires 120 absorb or merely couple to the substrate 110. The fact that the filtering characteristics of the nanowire array 100 are related to absorption in different parts thereof can lead to useful applications in optoelectronic devices.

A method of fabricating the nanowire array 100 includes (a) coating the substrate 110 with a resist layer (e.g. e-beam resist, photo resist, etc.); (b) generating a pattern of dots in the resist layer using a lithography technique (e.g. photolithography, e-beam lithography, holographic lithography, etc.); (c) developing the pattern in the resist layer; (d) depositing a mask layer (e.g. Al, Cr, $SiO_2$, $Si_3N_4$, Au, Ag, etc.); (e) lifting off the resist layer; (f) forming the nanowires 120 by dry etching the substrate 110; (g) optionally removing the mask player; wherein shapes and sizes of the dots determine the cross-sectional shapes and sizes of the nanowires 120. The resist can be poly(methyl methacrylate) (available from MicroChem located in Newton, Mass.). The mask layer can be aluminum deposited by a suitable technique such as e-beam evaporation, thermal evaporation, sputtering, etc. The mask layer can be about 40 nm thick. The substrate 110 can be a single crystalline silicon wafer. Dry etching can be conducted in an inductively coupled plasma-reactive ion etcher (such as those available from Surface Technology Systems, located at Redwood City, Calif.). An exemplary dry etching process includes alternating etch and deposition steps at room temperature, wherein 60 sccm of $SF_6$ and 160 sccm of $C_4F_8$ gases were used therein, respectively. The mask layer can be removed using a suitable etchant (e.g. Type A aluminum etchant available from Transene Company Inc. located in Danvers, Mass.) or solvent (e.g. acid, base, or organic solvent). SEM images can be taken in an SEM such as Zeiss Ultra55 available from Carl Zeiss NTS located at Peabody, Mass.

A method using the nanowire array 100 as a photodetector comprises: shining light on the nanowire array 100; measuring photocurrent on the nanowires 120; measuring photocurrent on the substrate 110; comparing the photocurrent on the nanowires 120 to the photocurrent on the substrate 110.

The nanowire array 100 can also be used as a submicron color filter. For example, each of the nanowires 120 in the nanowire array 100 can be placed on a photodetector. Only incident light with wavelengths in the dip of the reflectance spectrum of a nanowire can reach the photodetector below this nanowire. A method using the nanowire array 100 as a submicron color filter comprises shining white light on the nanowire array 100, detecting transmitted light below the nanowires 120.

A method using the nanowire array 100 as a static color display comprises: determining locations and radii of nanowires from an image to be displayed; fabricating the nanowires with the determined radii at the determined locations on the substrate; shining white light on the nanowire array. The word "static" here means that the display can only show one fixed image. By appropriate choice of individual nanowire placement and radius in the nanowire array 100, the nanowire array 100 can display a color image under white light illumination.

Figure 6:
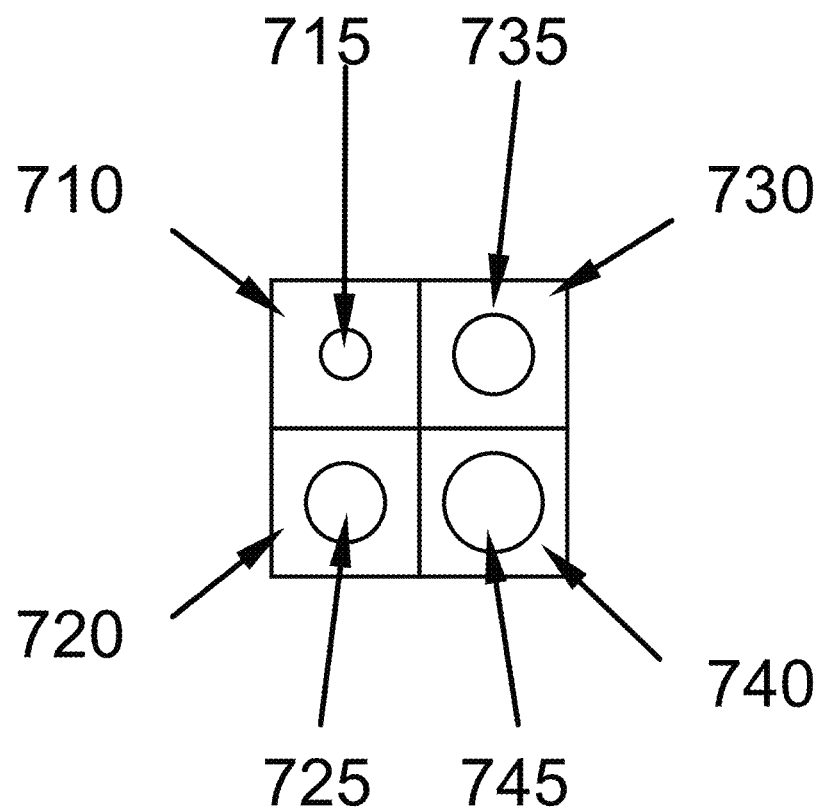
FIG. 6 shows a schematic top view of four pixels of the dynamic color display comprising a nanowire array according to an embodiment.

The nanowire array can also be used in a dynamic color display. The word "dynamic" here means that the display can display different images at different times. The dynamic color display, according to one embodiment, comprises the nanowire array 100, an array of independently addressable white light sources on a side of the substrate 110 opposite the nanowires 120, wherein each white light source corresponds to and is aligned in the substrate plane with one of the nanowires 120. The nanowires 120 can have predetermined radii and thus only allow light of desired wavelengths from the light sources to pass. For example, FIG. 6 shows a schematic top view of four pixels of the dynamic color display. Nanowires 715, 725, 735 and 745 respectively correspond to and are aligned with white light sources 710, 720, 730 and 740. The white light sources can be white LEDs. The nanowire 715 has a radius of about 45 nm and only allows red light to pass. The nanowires 725 and 735 have a radius of about 60 nm and only allows green light to pass. The nanowire 745 has a radius of about 70 nm and only allows blue light to pass. The independently addressable white light sources can be replaced by a scanning white light beam.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A nanowire array, comprising a substrate and a plurality of nanowires extending essentially perpendicularly from the substrate, wherein a ratio of a radius of the nanowires to a pitch of the nanowires is at most 0.5, wherein radii of the nanowires are from 10 to 1000 nm; lengths of the nanowires are from 0.01 to 10 µm.

2. A nanowire array of claim 1; wherein:
a refractive index of the nanowires is at least two times of a refractive index of a cladding of the nanowires.

3. A nanowire array of claim 1, wherein a number density of the nanowires is at most about 1.8/µm2.

4. The nanowire array of claim 1, wherein each of the nanowires is single crystalline, multi-crystalline or amorphous.

5. The nanowire array of claim 1, wherein the nanowires are composed of a semiconductor.

6. The nanowire array of claim 1, wherein the nanowires comprise one or more materials selected from the group consisting of Si, Ge, GaN, GaAs, SiO2, and Si3N4.

7. The nanowire array of claim 1, wherein the nanowires and the substrate are single crystalline and the lattices of the nanowires and the lattice of the substrate are continuous at interfaces therebetween.

8. The nanowire array of claim 1, wherein the nanowires are arranged in a predetermined pattern.

9. The nanowire array of claim 1, wherein a distance of a nanowire to a nearest neighbor of the nanowire along a direction parallel to the substrate is at least 800 nm.

10. The nanowire array of claim 1, wherein a reflectance spectrum thereof has a dip; the dip position shifts to shorter wavelength with decreasing radii of the nanowires; and the dip position is independent from a distance of a nanowire to a nearest neighbor of the nanowire along a direction parallel to the substrate.

11. The nanowire array of claim 1, wherein a reflectance spectrum thereof is independent from incident angles of illumination.

12. A method of fabricating the nanowire array of claim 1, comprising:
generating a pattern of dots in a resist layer using a lithography technique;
forming the nanowires by etching the substrate;
wherein shapes and sizes of the dots determine the cross-sectional shapes and sizes of the nanowires.

13. The method of claim 12, further comprising:
coating the substrate with the resist layer;
developing the pattern in the resist layer;
depositing a mask layer; lifting off the resist layer; and
optionally removing the mask player.

14. The method of claim 12, wherein the etching is dry etching.

15. A method using the nanowire array of claim 1 as a photodetector comprises:
shining light on the nanowire array;
measuring photocurrent on the nanowires;
measuring photocurrent on the substrate;
comparing the photocurrent on the nanowires to the photocurrent on the substrate.

16. A method using the nanowire array of claim 1 as a static color display comprises:
determining locations and radii of the nanowires from an image to be displayed;
fabricating the nanowires with the determined radii at the determined locations on the substrate;
shining white light on the nanowire array.

17. A color filter comprising the nanowire array of claim 1, wherein each nanowire is placed on a photodetector, wherein only incident light with wavelengths in a dip of a reflectance spectrum of each nanowire is allowed reach the photodetector below.

18. A method using the color filter of claim 17 comprises shining white light on the nanowire array, detecting transmitted light below the nanowires.

19. The nanowire array of claim 1, wherein the nanowires are composed of an electrically insulating material.

20. The nanowire array of claim 1, wherein the nanowire array is operable as a submicron color filter.

21. The nanowire array of claim 1, wherein at least one nanowire among the plurality of nanowires has a dip in a reflectance spectrum of the at least one nanowire, wherein a light of a wavelength in the dip incident on the at least one nanowire is guided by the at least one nanowire to be transmitted through the substrate.

22. The nanowire array of claim 21, wherein the dip is at an IR wavelength.

23. The nanowire array of claim 21, wherein the nanowire array is operable as an infrared light filter.

24. The nanowire array of claim 21, wherein the at least one nanowire comprises GaAs.

25. The nanowire array of claim 21, wherein the at least one nanowire has a diameter of between about 70 nm and about 500 nm.

26. A dynamic display comprises the nanowire array of claim 21.

27. A photodetector comprising the nanowire array of claim 21.

28. The nanowire array of claim 21, wherein the nanowire array is operable as a light filter.

29. The nanowire array of claim 21, wherein the nanowires do not substantially couple.

30. A dynamic color display comprises a nanowire array comprising a substrate and a plurality of nanowires extending essentially perpendicularly from the substrate, the nanowire array being operable as a color filter;
an array of independently addressable white light sources on a side of the substrate opposite the nanowires, wherein each white light source corresponds to and is aligned in the substrate plane with one of the nanowires.

31. The dynamic color display of claim 30, wherein the white light sources are white LEDs or a scanning white light beam.

32. The dynamic color display of claim 30, wherein a first group of the nanowires have a first radius, a second group of the nanowires have a second radius, and a third group of the nanowires have a third radius, wherein the first group of the nanowires only allow red light to pass, the second group of the nanowires only allow green light to pass, and the third group of the nanowires only allow blue light to pass.

* * * * *